United States Patent
Chen et al.

(10) Patent No.: US 9,087,705 B2
(45) Date of Patent: *Jul. 21, 2015

(54) THIN-FILM HYBRID COMPLEMENTARY CIRCUITS

(71) Applicant: International Business Machines Corporation, Armonk, NY (US)

(72) Inventors: Tze-Chiang Chen, Yorktown Heights, NY (US); Bahman Hekmatshoar-Tabari, White Plains, NY (US); Ghavam G. Shahidi, Pound Ridge, NY (US); Davood Shahrjerdi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/910,619

(22) Filed: Jun. 5, 2013

(65) Prior Publication Data

US 2014/0361303 A1    Dec. 11, 2014

(51) Int. Cl.
*H01L 29/66* (2006.01)
*H01L 27/06* (2006.01)
*H01L 29/737* (2006.01)

(Continued)

(52) U.S. Cl.
CPC ........ *H01L 27/0623* (2013.01); *H01L 29/6625* (2013.01); *H01L 29/66242* (2013.01); *H01L 29/66901* (2013.01); *H01L 29/66916* (2013.01); *H01L 29/66924* (2013.01); *H01L 29/735* (2013.01); *H01L 29/737* (2013.01); *H01L 29/808* (2013.01); *G11C 11/00* (2013.01); *H01L 29/1608* (2013.01); *H01L 29/20* (2013.01);

(Continued)

(58) Field of Classification Search
CPC .......................... H01L 29/7322; H01L 29/739
USPC ......... 257/197, 205, 273, 370, 477, 556, 557, 257/575
See application file for complete search history.

(56) References Cited

U.S. PATENT DOCUMENTS 5,196,907 A    3/1993    Birkle et al.
5,686,734 A    11/1997    Hamakawa et al.

(Continued)

FOREIGN PATENT DOCUMENTS

WO    WO 2006040735         4/2006
WO    WO 2007088494 A1      8/2007
WO    WO 2008017714 A1      2/2008

OTHER PUBLICATIONS

Notice of Allowance dated Oct. 15, 2014 received in U.S. Appl. No. 13/839,161.

(Continued)

*Primary Examiner* — Tan N Tran
(74) *Attorney, Agent, or Firm* — Scully, Scott, Murphy & Presser, P.C.; Louis J. Percello, Esq.

(57) ABSTRACT

Complementary circuits based on junction (or heterojunction) field effect transistor devices and bipolar junction (or heterojunction) transistor devices comprised of thin crystalline semiconductor-on-insulator substrates are provided which are compatible with low-cost and/or flexible substrates. Only one substrate doping type (i.e., n-type or p-type) is required for providing the complementary circuits and thus the number of masks (typically three or four) remains the same as that required for either n-channel or p-channel devices in the TFT level.

10 Claims, 13 Drawing Sheets

(51) Int. Cl.
- H01L 29/808 (2006.01)
- H01L 29/735 (2006.01)
- G11C 11/00 (2006.01)
- H01L 29/16 (2006.01)
- H01L 29/20 (2006.01)
- H01L 29/205 (2006.01)
- H01L 29/22 (2006.01)
- H01L 29/225 (2006.01)

(52) U.S. Cl.
CPC ............... *H01L29/205* (2013.01); *H01L 29/22* (2013.01); *H01L 29/225* (2013.01)

(56) References Cited

U.S. PATENT DOCUMENTS

| | | | |
|---|---|---|---|
| 6,534,790 | B2 | 3/2003 | Kato et al. |
| 7,579,287 | B2 | 8/2009 | Ishihara et al. |
| 8,084,786 | B2 | 12/2011 | John et al. |
| 8,779,597 | B2 | 7/2014 | Lee |
| 2003/0207524 | A1 | 11/2003 | Zhang et al. |
| 2004/0256633 | A1 | 12/2004 | Thornton et al. |
| 2010/0314664 | A1 | 12/2010 | John et al. |
| 2011/0003456 | A1 | 1/2011 | Mazzola |
| 2012/0049282 | A1 | 3/2012 | Chen et al. |
| 2012/0118383 | A1 | 5/2012 | Bedell et al. |
| 2012/0210932 | A1 | 8/2012 | Hekmatshoar-Tabari et al. |
| 2012/0228611 | A1 | 9/2012 | Chan et al. |
| 2013/0313552 | A1 | 11/2013 | Hekmatshoar-Tabari et al. |

OTHER PUBLICATIONS

Hekmatshoar, B., et al., "Novel heterojunction solar cells with conversion efficiencies approaching 21% on p-type crystalline silicon substrates", Electron Devices Meeting (IEDM), 2011 IEEE International, Date of Conference: Dec. 5-7, 2011, pp. 36.6.1-36.6 4.

Office Action dated Dec. 8, 2014 received in U.S. Appl. No. 13/839,100.

Office Action dated Nov. 24, 2014 received in U.S. Appl. No. 13/839,213.

Sakamoto, Y., et al; "Perfluoropentacene: High-performance pn junctions and complementary circuits with pentacene", Journal of the American Chemical Society, Jul. 7, 2004, 126, No. 26, pp. 8138-8140.

Klauk, H., et al., "Flexible organic complementary circuits", Electron Devices, IEEE Transactions on Electron Devices, Apr. 2005, vol. 52, No. 4, pp. 618-622.

Hekmatshoar, B., et al., "Heterojunction bipolar transistors with hydrogenated amorphous silicon contacts on crystalline silicon", Electronics Letters Aug. 30, 2012 vol. 48, No. 18, pp. 1161-1163.

U.S. Appl. No. 13/481,048 Entitled, "Bipolar Junction Transistor With Epitaxial Contacts", filed May 25, 2012, First Named Inventor: Bahman Hekmatshoartabari.

U.S. Office Action dated Jan. 23, 2015 received in U.S. Appl. No. 13/838,695.

U.S. Office Action dated Aug. 1, 2014 received in U.S. Application, namely U.S. Appl. No. 13/389,100.

U.S. Office Action dated Aug. 21, 2014 received in U.S. Application, namely U.S. Appl. No. 13/838,695.

Gelatos, A.V and Kanicki, J., "Investigation of the Silicon Nitride on Hydrogenated Amorphous Silicon Interface", Mat. Res. Soc. Symp. Proc., 1989, vol. 149., pp. 729-734.

Campmany, J.L., et al., "Plasma-deposited silicon nitride films with low hydrogen content for amorphous silicon thin-film transistors application", Sensors and Actuators A, 1993, v.77-38, pp. 333-336.

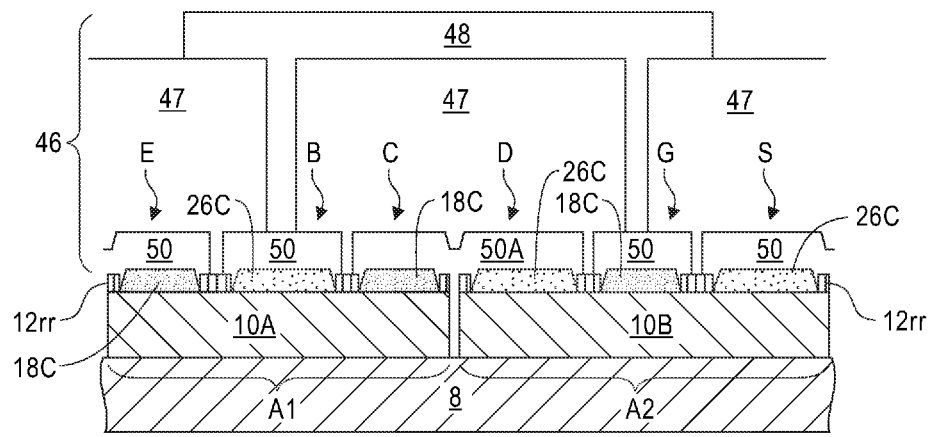
FIG. 27
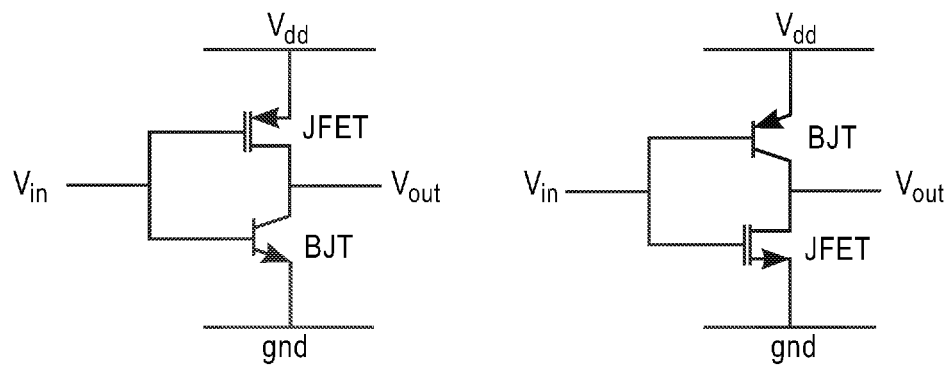
FIG. 28A
FIG. 28B

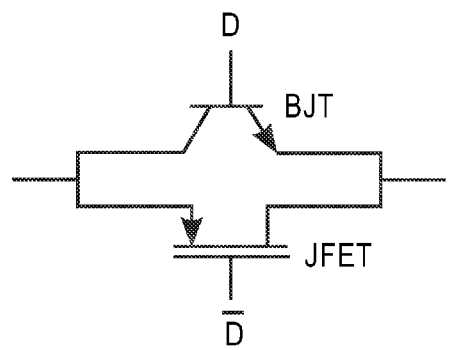
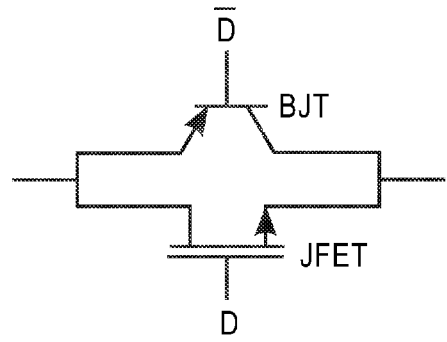
FIG. 29A        FIG. 29B
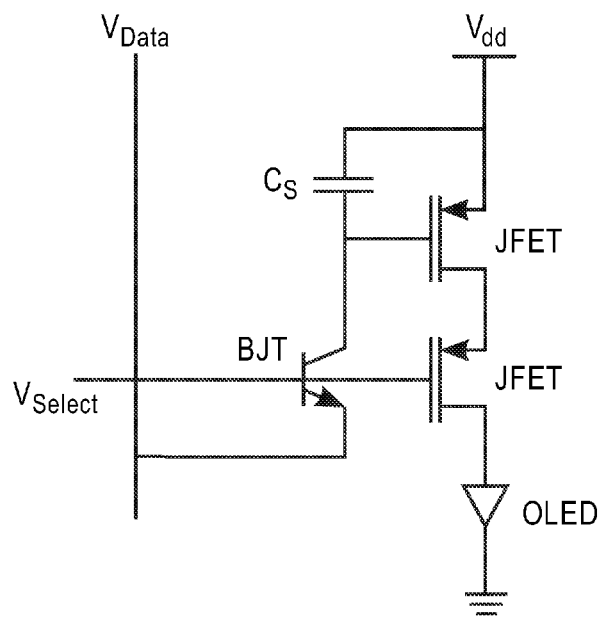
FIG. 30

THIN-FILM HYBRID COMPLEMENTARY CIRCUITS

RELATED APPLICATIONS

This application is related to the following co-pending and co-assigned U.S. Applications:

U.S. Ser. No. 13/839,161, filed on Mar. 15, 2013, which claims benefit of U.S. Provisional Application Ser. No. 61/651,140, filed on May 24, 2012; U.S. Ser. No. 13/839,213, filed on Mar. 15, 2013, which claims benefit of U.S. Provisional Application Ser. No. 61/656,090, filed on Jun. 6, 2012; U.S. Ser. No. 13/839,100, filed on Mar. 15, 2013, which claims benefit of U.S. Provisional Application Ser. No. 61/651,125, filed on May 24, 2012; and U.S. Ser. No. 13/839,275, filed on Mar. 15, 2013, which claims benefit of U.S. Provisional Application Ser. No. 61/651,134, filed on May 24, 2012. The contents of each of the aforementioned U.S. Applications are incorporated herein by reference in their entirety.

BACKGROUND

The present application relates to a semiconductor structure and circuits that contain the semiconductor structure. More particularly, the present application relates to a semiconductor structure including thin-film complementary semiconductor devices and complementary circuits that include such a semiconductor structure.

Complementary circuits are highly of interest in various areas of large-area and flexible electronics for driving, programming, addressing and/or memory applications. In most thin-film transistor (TFT) designs, an n-channel or p-channel TFT process requires three or four mask in the TFT level. However, having complementary circuits comprising both types of transistors increases the number of masks to six or seven, which is a significant cost addition that may not be affordable for many applications.

SUMMARY

Complementary circuits based on junction (or heterojunction) field effect transistor (e.g., JFET or HJFET) devices and bipolar junction (or heterojunction) transistor (e.g., BJT or HBT) devices comprised of thin crystalline semiconductor-on-insulator substrates are provided which are compatible with low-cost and/or flexible substrates. In the present application, only one substrate doping type (i.e., n-type or p-type) is required for providing the complementary circuits and thus the number of masks (typically three or four) remains the same as that required for either n-channel or p-channel devices in the TFT level.

In one aspect of the present application, a semiconductor structure is provided. The semiconductor structure of the present application includes a first active region comprising a first crystalline semiconductor portion of a first conductivity type located on one portion of a surface of an insulator layer, and a second active region comprising a second crystalline semiconductor portion of the first conductivity type located on another portion of the insulator layer, wherein the second active region is laterally spaced apart from the first active region. The structure further includes a bipolar junction transistor located within the first active region and comprising an emitter of a second conductivity type, a base of the first conductivity type and a collector of the second conductivity type, wherein the base is located between, and laterally spaced apart from, the emitter and the collector. The structure also includes a junction field effect transistor located within the second active region and comprising a drain of the first conductivity type, a gate of the second conductivity type, and a source of the first conductivity type, wherein the gate is located between, and laterally spaced apart from, the drain and the source. In accordance with the present application, the second conductivity type is opposite the first conductivity type.

In another aspect of the present application, complementary circuits are provided. The complementary circuits include a bipolar junction transistor located within a first active region and comprising an emitter of a second conductivity type, a base of a first conductivity type and a collector of the second conductivity type, wherein the base is located between, and laterally spaced apart from, the emitter and the collector, the first active region comprises a first crystalline semiconductor portion of the first conductivity type, and wherein the first conductivity type is opposite from the second conductivity type. The complementary circuit of this embodiment further includes a junction field effect transistor located within a second active region and comprising a drain of the first conductivity type, a gate of the second conductivity type, and a source of the first conductivity type, wherein the gate is located between, and laterally spaced apart from, the drain and the source, the second active region comprises a second crystalline semiconductor portion of the first conductivity type, and wherein there is at least one electrical couple between the bipolar junction transistor and the junction field effect transistor.

In one embodiment, the collector of the bipolar junction transistor is electrically coupled to the drain of the junction field effect transistor and the base of the bipolar junction transistor is electrically coupled to the gate of the junction field effect transistor. In such an embodiment, the source of the junction field effect transistor is electrically coupled to a first terminal of a power supply and the emitter of the bipolar junction transistor is electrically coupled to a second terminal of the power supply.

In another further embodiment, the collector of the bipolar junction transistor is electrically coupled to the source of the junction field effect transistor and are configured to either receive an input signal or provide an output signal and the emitter of the bipolar junction transistor is electrically coupled to the drain of the junction field effect transistor and are configured to either receive an input signal or provide an output signal, and wherein the base of the bipolar junction transistor is configured to receive a first control signal and the gate of the junction field effect transistor is configured to receive a second control signal, wherein the first and second control signals applying a control logic applied to the input signal.

In a further embodiment, the complementary circuit includes a first complementary inverter circuit and a second complementary inverter circuit in a cross-coupled configuration having an output of each inverter feedback as input to the other inverter. Both first complementary and second complementary inverter circuits comprise: a bipolar junction transistor located within a first active region and comprising an emitter of a second conductivity type, a base of a first conductivity type and a collector of the second conductivity type, wherein the base is located between, and laterally spaced apart from, the emitter and the collector, the first active region comprises a first crystalline semiconductor portion of the first conductivity type, and the first conductivity type is opposite from the second conductivity type; and a junction field effect transistor located within a second active region and comprising a drain of the first conductivity type, a gate of the second conductivity type, and a source of the first conductivity type, wherein the gate is located between, and laterally spaced apart from, the drain and the source, the second active region comprises a second crystalline semiconductor portion of the first conductivity type, wherein the collector of the bipolar junction transistor is electrically coupled to the drain of the junction field effect transistor and wherein the base of the bipolar junction transistor is electrically coupled to the gate of the junction field effect transistor, and the source of the junction field effect transistor is electrically coupled to a first terminal of a power supply and the emitter of the bipolar junction transistor is electrically coupled to a second terminal of the power.

BRIEF DESCRIPTION OF THE DRAWINGS

FIG. 27 is a pictorial representation (through a cross sectional view) illustrating the structure of FIG. 26 after forming an interconnect level containing first metal contacts.

FIG. 28A is a circuit schematic of an exemplary complementary inverter circuit including the semiconductor structure of the present application formed upon a p-type crystalline semiconductor material.

FIG. 28B is a circuit schematic of an exemplary complementary inverter circuit including the semiconductor structure of the present application formed upon an n-type crystalline semiconductor material.

FIG. 29A is a circuit schematic of an exemplary pass transistor circuit including the semiconductor of the present application formed upon a p-type crystalline semiconductor material.

FIG. 29B is a circuit schematic of an exemplary pass transistor circuit including the semiconductor of the present application formed upon an n-type crystalline semiconductor material.

FIG. 30 is a circuit schematic of an exemplary OLED driver circuit including the semiconductor structure of the present application.

DETAILED DESCRIPTION

Figure 1:
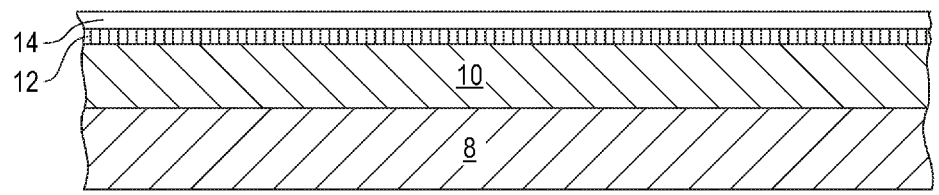
FIG. 1 is a pictorial representation (through a cross sectional view) illustrating a crystalline semiconductor material located on an surface of an insulator layer and having a material stack of, from bottom to top, a blanket layer of passivation material and a blanket layer of sacrificial material located on a surface of the crystalline semiconductor material in accordance with an embodiment of the present application.

The present application will now be described in greater detail by referring to the following discussion and drawings that accompany the present application. It is noted that the drawings of the present application are provided for illustrative purposes and, as such, they are not drawn to scale. In the drawings and description that follows, like elements are described and referred to by like reference numerals.

In the following description, numerous specific details are set forth, such as particular structures, components, materials, dimensions, processing steps and techniques, in order to provide a thorough understanding of the present application. However, it will be appreciated by one of ordinary skill in the art that the present application may be practiced with viable alternative process options without these specific details. In other instances, well-known structures or processing steps have not been described in detail in order to avoid obscuring the various embodiments of the present application.

The term "crystalline" is used throughout the present application to denote a single crystalline material, a multi-crystalline material or a polycrystalline material. Typically, the crystalline semiconductor material that is employed in the present application is comprised of a single crystalline semiconductor material. The term "non-crystalline" is used throughout the present application to denote an amorphous, nano-crystalline or micro-crystalline material. Typically, the non-crystalline semiconductor material that is employed in the present application is amorphous. The term "intrinsic" is used throughout the present application to denote a semiconductor material that contains no doping atoms therein or alternatively a semiconductor material in which the concentration of dopant atoms therein is less than $10^{15}$ atoms/cm$^3$. The term "hydrogenated" is used throughout the present application to denote that a semiconductor material includes hydrogen therein.

The term "circuit" is used throughout the present application to denote a set of devices that provides at least one current path between a power supply device and electrical ground. The term "complementary circuit" is used throughout the present application to denote a circuit that includes two different types of transistors. In the present application, one of the transistors is a bipolar junction transistor (BJT), while the other is a junction field effect transistors (JFET). The BJT can include a homojunction device or a heterojunction device. Likewise, the JFET can include a homojunction device or a heterojunction device.

A bipolar junction transistor has terminals labeled base, collector, and emitter. A small current at the base terminal (that is, flowing between the base and the emitter) can control or switch a much larger current between the collector and emitter terminals. Bipolar junction transistors conduct by using both majority and minority carriers.

For a junction field effect transistor, the terminals are labeled gate, source, and drain, and a voltage at the gate can control a current between source and drain. The JFET gate forms a p-n diode with the channel which lies between the source and drain.

The present application provides a semiconductor structure that includes thin film complementary devices, i.e., BJTs and JFETs, located on a same conductivity type substrate and complementary circuits that include the semiconductor structure of the present application. The semiconductor structure of the present application, which is shown for example, in FIG. 13, 23 or 26, includes a first active region comprising a first crystalline semiconductor portion of a first conductivity type located on one portion of a surface of an insulator layer, and a second active region comprising a second crystalline semiconductor portion of the first conductivity type located on another portion of the insulator layer, wherein the second active region is laterally spaced apart from the first active region. The structure further includes a bipolar junction transistor located within the first active region and comprising an emitter of a second conductivity type, a base of the first conductivity type and a collector of the second conductivity type, wherein the base is located between, and laterally spaced apart from, the emitter and the collector. The structure also includes a junction field effect transistor located within the second active region and comprising a drain of the first conductivity type, a gate of the second conductivity type, and a source of the first conductivity type, wherein the gate is located between, and laterally spaced apart from, the drain and the source. In accordance with the present application, the second conductivity type is opposite the first conductivity type.

Various digital and analog circuits can be realized utilizing the semiconductor structure of the present application. Examples include, but are not limited to, logic gates, e.g., AND, NAND, OR, and NOR, latches, multiplexers, amplifiers, memory, driver or addressing circuits for active matrix applications such as, for example, displays and sensors. In the present application, an inverter circuit, a SRAM cell circuit, a pass transistor circuit, and an OLED driver circuit will be specifically exemplified.

Reference is now made to FIGS. 1-15 which illustrate one embodiment of the present application in which a non-self aligned process is employed in forming an exemplary semiconductor structure in accordance with the present application, which can be used within an inverter circuit. Although an inverter circuit is described and illustrated, the same basic processing steps can be used in forming other types of circuits including, but not limited to, a SRAM cell circuit, a pass transistor circuit, and an OLED driver circuit.

Referring first to FIG. 1, there is an initial structure that can be employed in one embodiment of the present application. The initial structure illustrated in FIG. 1 includes a crystalline semiconductor material 10 having a first side and a second side which is opposite the first side. A material stack of, from bottom to top, a blanket layer of passivation material 12 and a blanket layer of sacrificial material 14 is located on one of the sides of the crystalline semiconductor material 10. The blanket layer of passivation material 14 can also be referred to herein as a blanket layer of first sacrificial material. An insulator layer 8 such as, for example, an oxide, nitride, and/or oxynitride, is located on the other side of the crystalline semiconductor material 10. In some embodiments (not shown), a handle substrate such as, for example, a semiconductor substrate, glass, plastic or metal foil can be located directly beneath the insulating layer 8. In embodiments where the handle substrate is insulating, a separate insulating layer is not needed since the insulating handle substrate can serve as the insulating material. In yet other embodiments, the crystalline semiconductor material 10 may represent a topmost semiconductor layer of a multilayered semiconductor material stack.

In one embodiment, the crystalline semiconductor material 10 that can be employed in the present application can be an III-V compound semiconductor which includes at least one element from Group IIIA (i.e., Group 13) of the Periodic Table of Elements and at least one element from Group VA (i.e., Group 15) of the Periodic Table of Elements. The range of possible formulae for suitable III-V compound semiconductors that can be used in the present application is quite broad because these elements can form binary (two elements, e.g., gallium (III) arsenide (GaAs)), ternary (three elements, e.g., indium gallium arsenide (InGaAs)) and quaternary (four elements, e.g., aluminum gallium indium phosphide (AlInGaP)) alloys.

In another embodiment of the present application, the crystalline semiconductor material 10 can be a semiconductor material having the formula $Si_yGe_{1-y}$ wherein y is $0 \leq y \leq 1$. In some embodiments, in which y is 1, the crystalline semiconductor material 10 can be comprised entirely of Si. In another embodiment, in which y is 0, the crystalline semiconductor material 10 can be comprised entirely of Ge. In yet another embodiment and when y is other than 0 or 1, the crystalline semiconductor material 10 can be comprised entirely of a SiGe alloy. In yet another embodiment of the present application, the crystalline semiconductor material 10 can be a semiconductor material comprised of SiC.

In some embodiments of the present application, the crystalline semiconductor material 10 may include nitrogen, oxygen, fluorine, deuterium, chlorine or any combination thereof. When present, the concentration of the aforementioned species can be from 1 atomic percent (%) to 10 atomic percent (%). Other concentrations that are lesser than, or greater than, the aforementioned concentration range can also be present.

In accordance with the present application, the entirety of the crystalline semiconductor material 10 is of a first conductivity type, i.e., either p-type or n-type. As used herein, "p-type" refers to the addition of impurities to an intrinsic semiconductor that creates deficiencies of valence electrons (i.e., holes). In a Si-containing semiconductor material, examples of p-type dopants, i.e., impurities, include but are not limited to, boron, aluminum, gallium and indium. In one embodiment, in which the first conductivity type of the crystalline semiconductor material 10 of the present application is p-type, the p-type dopant is present in a concentration ranging from $1 \times 10^9$ atoms/cm$^3$ to $1 \times 10^{20}$ atoms/cm$^3$. In another embodiment, in which the first conductivity type of the crystalline semiconductor material 10 of the present application is p-type, the p-type dopant is present in a concentration ranging from $1 \times 10^{14}$ atoms/cm$^3$ to $1 \times 10^{19}$ atoms/cm$^3$. As used herein, "n-type" refers to the addition of impurities that contributes free electrons to an intrinsic semiconductor. In a Si-containing semiconductor, examples of n-type dopants, i.e., impurities, include but are not limited to, antimony, arsenic and phosphorous. In one embodiment, in which the first conductivity type of the crystalline semiconductor material 10 of the present application is n-type, the n-type dopant is present in a concentration ranging from $1 \times 10^9$ atoms/cm$^3$ to $1 \times 10^{20}$ atoms/cm$^3$. In another embodiment, in which the first conductivity type of the crystalline semiconductor material 10 of the present application is n-type, the n-type dopant is present in a concentration ranging from $1 \times 10^{14}$ atoms/cm$^3$ to $1 \times 10^{19}$.

The dopant concentration of the first conductivity type within the crystalline semiconductor material 10 of the present application may be graded or uniform. By "uniform" it is meant that the dopant concentration of first conductivity type is the same throughout the entire thickness of the crystalline semiconductor material 10. For example, a crystalline semiconductor material 10 having a uniform dopant concentration of the first conductivity type may have the same dopant concentration at the upper surface and bottom surface of the semiconductor material, as well as the same dopant concentration at a central portion of the semiconductor material between the upper surface and the bottom surface of the crystalline semiconductor material 10. By "graded" it is meant that the dopant concentration of the first conductivity type varies throughout the thickness of the crystalline semiconductor material 10. For example, a crystalline semiconductor material 10 having a graded dopant concentration may have an upper surface with a greater dopant concentration of the first conductivity type than the bottom surface of the crystalline semiconductor material 10, and vice versa. It is noted that the other semiconductor materials that are doped and that are mentioned in this application may have a graded or uniform doping concentration.

In some embodiments, the first conductivity type can be introduced during the growth of a crystalline semiconductor material that can be used in providing the crystalline semiconductor material 10 of the present application. For example, an in-situ doped epitaxial growth process can be used in forming the crystalline semiconductor material 10. Alternatively, the conductivity type can be introduced into an intrinsic crystalline semiconductor material by utilizing ion implantation, and/or gas phase doping and the doped crystalline semiconductor material can be employed as the crystalline semiconductor material 10. The thickness of the crystalline semiconductor material 10 can be from 3 nm to 3 μm. Other thicknesses that are lesser than, or greater than, the aforementioned thickness range can also be employed for the thickness of the crystalline semiconductor material 10.

A blanket layer (i.e., contiguous layer) of a passivation material 12 is formed on an entire surface of the crystalline semiconductor material 10. In some embodiments, and as illustrated in the drawings of the present application, the blanket layer of passivation material 12 includes a single layer. In other embodiments, the blanket layer of passivation material 12 includes a multilayered structure containing various layers of passivation materials. The passivation material serves to saturate dangling bonds on the surface of the crystalline semiconductor material 10, in order to reduce the recombination of carriers at the surface of the crystalline semiconductor material 10. The passivation material may also reduce the recombination of carriers at the surface of the crystalline semiconductor material 10 by "field-induced" passivation, for example by repelling the minority carriers from the surface of the crystalline semiconductor material 10. Field-induced passivation may be facilitated by the presence of fixed electronic charges in the passivation layer, formation of dipoles at the passivation/substrate interface, or the electric field induced by the workfunction difference between the passivation layer and the substrate semiconductor material. The passivation material may also serve to prevent air or moisture from being introduced into the crystalline semiconductor material 10.

The passivation material that can be employed in the present application includes, for example, a hard mask material such as, for example, a semiconductor oxide, a semiconductor nitride, a semiconductor oxynitride, or a multilayered stack thereof. The passivation material may also be comprised of a high-k dielectric (k>silicon oxide) such as aluminum oxide or hafnium oxide. In some embodiments, which is more typical to III-V materials, the passivation material may be comprised of a substantially undoped semiconductor material having a larger band gap than that of the crystalline semiconductor material 10 to passivate the surface of the crystalline semiconductor material 10 by repelling the minority carriers induced by workfunction difference between the semiconductor materials formed by the passivation material and the crystalline semiconductor material 10.

Examples of passivation material that can be used as the blanket layer of passivation material 12 include, but not limited to, hydrogenated amorphous silicon nitride (a-SiN$_x$:H), hydrogenated amorphous silicon oxide (a-SiO$_x$:H), hydrogenated amorphous silicon oxynitride (a-SiN$_x$O$_y$:H), aluminum oxide (Al$_2$O$_3$) and hafnium-oxide (HfO$_2$). Nano-crystalline and microcrystalline forms of hydrogenated materials such as SiO$_x$, SiN$_x$ and SiN$_x$O$_y$ may also be used. The blanket layer of passivation material 12 can have a thickness from 5 nm to 50 nm. Other thicknesses that are below or above the aforementioned thickness range can also be employed.

In one embodiment, the blanket layer of passivation material 12 can be formed by a deposition process including, for example, chemical vapor deposition, plasma enhanced chemical vapor deposition, atomic layer deposition or chemical solution deposition. In other embodiments, the blanket layer of passivation material 12 can be formed utilizing a thermal technique such as, for example, oxidation and/or nitridation. In yet other embodiments, a combination of a deposition process and a thermal technique can be used to form the blanket layer of passivation material 12. In still another embodiment, which is more typical to III-V materials, a substantially undoped semiconductor material having a larger band gap than that of the crystalline semiconductor material 10 can be used as the blanket layer of passivation material 12 and such a material can be grown on the crystalline semiconductor material 10 by conventional growth techniques such as, for example, molecular beam epitaxy or metal-organic chemical vapor deposition. Hydrogen may be included in some of the above mentioned processes to form a passivation material that is hydrogenated. In one embodiment in which hydrogen is present in the passivation material, the hydrogen content within the passivation material may range from 5 atomic % to 40 atomic %. The blanket layer of passivation material 12 that is formed at this stage of the present application is a contiguous layer.

Next, a blanket layer of sacrificial material 14 is formed on an exposed topmost surface of the blanket layer of passivation material 12. In some embodiments, and as illustrated in the drawings of the present application, the blanket layer of sacrificial material 14 includes a single layer. In other embodiments, the blanket layer of sacrificial material 14 includes a multilayered structure containing various layers of sacrificial materials. As shown, the blanket layer of sacrificial material 14 is a contiguous layer that is present on the entire topmost surface of the blanket layer of passivation material 12.

The blanket layer of sacrificial material 14 that is employed in the present application includes a layer (or layers) of semiconducting material (or materials), which is (are) substantially resistive to dilute HF. Resistance against dilute HF for a given material is a relative term and depends on the concentration of HF solution and exposure time to HF, as well as the thickness of the material being used. For most substrate materials, typically a 1:100 HF solution (1:100 refers to the volume ratio of HF to de-ionized water) is used for hydrogen termination and the exposure time to dilute HF is typically in the range of 30 seconds to 5 minutes; however, as known in the art, longer or shorter times may be used as well. Also, higher or lower concentrations of HF may be used.

Substantial resistance against HF indicates that the sacrificial material serves as barrier against HF preventing HF from reaching the underlying passivation material which is typically soluble in HF. Examples of semiconductor materials that can be used as the blanket layer of sacrificial material 14 include, but are not limited to, a-Si:H, a-SiC:H, a-SiGe:H or combinations thereof; throughout the present application, the symbol "a" denotes amorphous and the symbol "H" denotes hydrogenated. The content of hydrogen within the sacrificial material may vary, but a typically range of hydrogen within the sacrificial material is from 5 atomic % to 40 atomic % hydrogen. Nanocrystalline and microcrystalline forms of these materials may also be used. Combinations or stacks of these materials may be used as the blanket layer of sacrificial material 14. Typically Si and SiC based materials are preferred over Ge and SiGe based materials. For example, a 3-5 nm (or thicker) layer of a-Si:H or a-SiC:H is typically substantially resistant against 1:100 dilute HF for exposure times in the range of 30 seconds to 5 minutes.

The blanket layer of sacrificial material 14 is typically non-doped and can be formed by conventional deposition processes. In one embodiment, the blanket layer of sacrificial material 14 can be formed by plasma enhanced chemical vapor deposition (PECVD). In other embodiments, a hot-wire chemical vapor deposition (HWCVD) process can be used in forming the blanket layer of sacrificial material 14. In yet another embodiment, sputtering can be used in forming the blanket layer of sacrificial material 14. The blanket layer of sacrificial material 14 can be formed using conditions, source gases and other gases that are well known to those skilled in the art including those that will be mentioned in greater detail herein below in forming the first and second semiconductor contact materials. The blanket layer of sacrificial material 14 can have a thickness from 5 nm to 50 nm. Other thicknesses that are below or above the aforementioned thickness range can also be employed.

Figure 2:
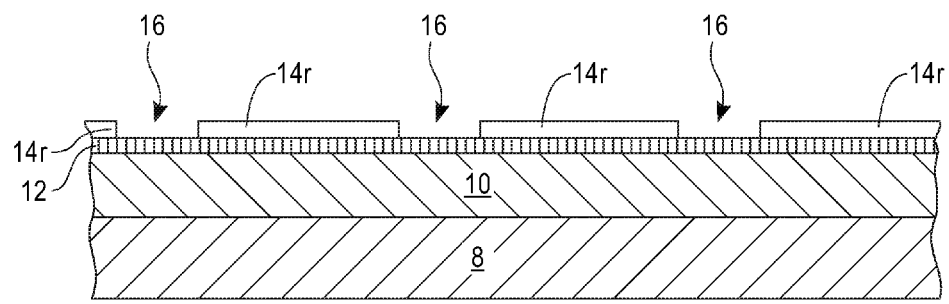
FIG. 2 is a pictorial representation (through a cross sectional view) illustrating the structure of FIG. 1 after patterning the blanket layer of sacrificial material to include first contact openings that expose different portions of a topmost surface of the blanket layer of passivation material.

Referring now to FIG. 2, there is illustrated the structure of FIG. 1 after patterning the blanket layer of sacrificial material 14 to include first contact openings 16 that expose different portions of the topmost surface of the blanket layer of passivation material 12. The number of first contact openings 16 that are formed varies and is dependent on the type and number of semiconductor devices that are to be subsequently formed on different surface portions of the crystalline semiconductor material 10. In one embodiment, and as illustrated in the drawings, three first contact openings 16 are formed.

The remaining portions of the blanket layer of sacrificial material 14, which can be herein after referred to as first sacrificial material layer portions, are designated as 14r in the drawings of the present application. The remaining portions of the blanket layer of sacrificial material 14 may also be referred to as first patterned sacrificial material layer portions.

The patterning of the blanket layer of sacrificial material 14 is performed utilizing lithography and etching. Lithography includes forming a photoresist material (not shown) on an exposed surface of the blanket layer of sacrificial material 14, exposing the photoresist material to a desired pattern of radiation, and developing the photoresist material utilizing a conventional resist developer. The desired pattern that is formed into the photoresist material can be in the form of a via or a trench. The etching step, which transfers the pattern from the patterned photoresist into the blanket layer of sacrificial material 14, can include dry etching (i.e., reactive ion etching, ion beam etching, or plasma etching), wet chemical etching, or a combination thereof. In one embodiment of the present application, a selective etch process (typically a dry etch) is used to pattern the blanket layer of sacrificial material 14. For example, plasma chemistry based on $SF_6$, $SF_6/O_2$ or $SF_6/Cl_2F_2$ may be used for reactive ion etching. The etch rate of the blanket layer of sacrificial material 14 is typically higher than that of the blanket layer of passivation material 12 in such plasmas. Alternatively, an etch process (e.g., based on $CF_4$) which is not selective may also be used by controlling the etch time. After pattern transfer, the patterned photoresist is typically removed from the structure utilizing a conventional stripping process such as, for example, ashing.

In some embodiments, the width of each first contact opening 16 that is formed is in the range of 10 nm to 100 nm. In other embodiments, the width of each first contact opening 16 that is formed is in the range of 50 nm to 1 µm. In yet other embodiments, the width of each first contact opening 16 that is formed is in the range of 500 nm to 100 µm. First contact openings 16 having a width narrower than 10 nm or wider than 100 µm can also be employed.

Figure 3:
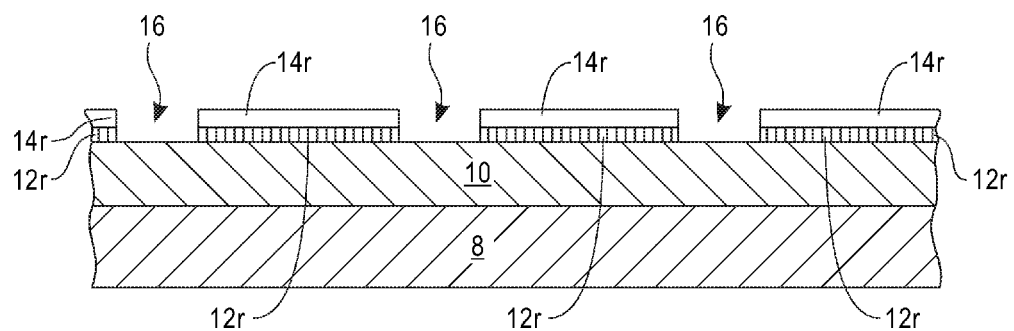
FIG. 3 is a pictorial representation (through a cross sectional view) illustrating the structure of FIG. 2 after transferring the first contact openings into the blanket layer of passivation material using remaining portions of the blanket layer of sacrificial material as an etch mask, wherein after the transferring of the first contact openings into the blanket layer of passivation material first surface portions of the crystalline semiconductor material are exposed.

Referring to FIG. 3, there is illustrated the structure of FIG. 2 after transferring each first contact opening 16 into the blanket layer of passivation material 12 using remaining portions of the blanket layer of sacrificial material, i.e., the first sacrificial material layer portions 14r, as an etch mask. After the transferring each first contact opening 16 into the blanket layer of passivation material 12, first surface portions of the crystalline semiconductor material 10 are exposed. The remaining portions of the blanket layer of passivation material 12, which can be herein after referred to as first passivation material layer portions, are designated as 12r in the drawings of the present application. The remaining portions of the blanket layer of passivation material 12 may also be referred to as first patterned passivation material layer portions.

The transferring of each first contact opening 16 into the blanket layer of passivation material 12 includes an etching process which is selective for removing the exposed portions of the blanket layer of passivation material 12 as compared with the overlying first sacrificial material layer portions 14r. The etch used in transferring each first contact opening 16 can include dry etching (i.e., reactive ion etching, ion beam etching, or plasma etching), wet chemical etching, or a combination thereof. Typically, dilute HF is used for transferring each first contact opening 16 into the blanket layer of passivation material 12. In some embodiments, the dilute HF may include a sufficiently long over-etch time so that the exposed first surface portion of the crystalline semiconductor material 10 is hydrogen terminated and ready for the deposition of the semiconductor contact material. Other processes/materials may be used for etching the blanket layer of passivation material 12 (selectively against the first sacrificial material layer portions 14r), followed by exposing the first surface portion of the crystalline semiconductor material 10 to dilute HF for hydrogen termination. Also, other techniques know in the art may be used for hydrogen termination instead of dilute HF, or in addition to (for example following or preceding) dilute HF for enhanced hydrogen termination.

Figure 4:
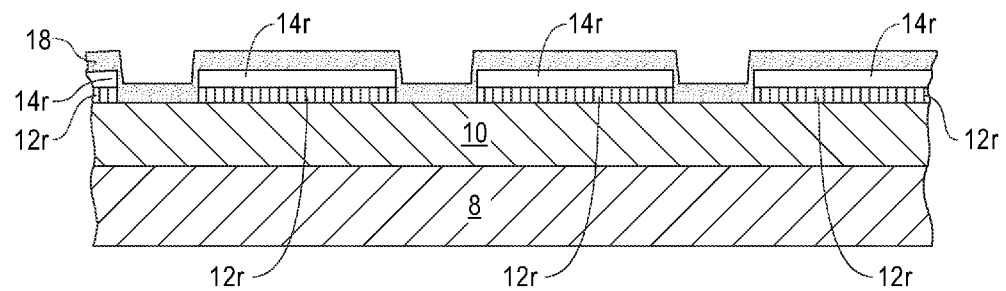
FIG. 4 is a pictorial representation (through a cross sectional view) illustrating the structure of FIG. 3 after forming at least one first semiconductor material on the first surface portions of the crystalline semiconductor material and atop remaining portions of the blanket layer of sacrificial material.

Referring now to FIG. 4, there is illustrated the structure of FIG. 3 after forming at least one first semiconductor material 18 on each first surface portion of the crystalline semiconductor material 10 and atop the remaining portions of the blanket layer of sacrificial material, i.e., first sacrificial material layer portions 14r.

In one embodiment, the at least one first semiconductor material 18 is a single layer of semiconductor material. In another embodiment, the at least one first semiconductor material 18 can be a multilayered structure comprising at least two layers of the same or different semiconductor materials. When a single semiconductor material layer is employed, the at least one first semiconductor material 18 is doped to have a conductivity type, e.g., p-type or n-type, that is the same or different from that of the crystalline semiconductor material 10 in which contact is made. When a multilayered structure is employed, the at least one first semiconductor material may comprise semiconductor materials that are all doped, or some that are doped and some that are intrinsic. When doped, the semiconductor material layers of the multilayered structure have a conductivity type that is the same or different from that of the crystalline semiconductor material 10. By way of example, the first semiconductor material 18 may comprise a stack of, from bottom to top, an intrinsic semiconductor material and a doped semiconductor material; a stack of, from bottom to top, a doped semiconductor material, and another doped semiconductor material each of the same conductivity and comprising a same semiconductor material; or a stack of, from bottom to top, a doped semiconductor material, and another doped semiconductor material each of the same conductivity and comprising different semiconductor materials. The semiconductor materials within a multilayered stack which can be used as the at least one first semiconductor material 18 may have different band gaps from each other.

The at least one first semiconductor material 18 may be crystalline, non-crystalline or a combination of crystalline and non-crystalline. In some embodiments, a single layer of first semiconductor material 18 can be formed that comprises crystalline semiconductor portions and adjoining non-crystalline semiconductor material portions. In such an embodiment, each single crystalline portion is formed in direct contact with a first surface portion of the crystalline semiconductor material 10 and each adjoining non-crystalline portion is present on the uppermost surface of each first sacrificial material layer portion 14r.

The at least one first semiconductor material 18 can be hydrogenated, non-hydrogenated or, if a multilayered stack is used the various semiconductor materials within the multilayered stack can be hydrogenated, non-hydrogenated or a combination of hydrogenated and non-hydrogenated. In one embodiment in which at least one of the semiconductor material layers of the at least one first semiconductor material 18 is hydrogenated, the hydrogenated semiconductor material may contain from 5 atomic % to 40 atomic % hydrogen therein. In another embodiment in which at least one of the semiconductor material layers of the at least one first semiconductor material 18 is hydrogenated, the hydrogenated semiconductor material may contain from 10 atomic % to 25 atomic % hydrogen therein. In yet another embodiment in which the at least one of the semiconductor material layers of the at least one first semiconductor material 18 is hydrogenated, the hydrogenated semiconductor material may contain from 20 atomic % to 30 atomic % hydrogen therein.

The at least one first semiconductor material 18 may comprise a same and/or different semiconductor material(s) as that of the crystalline semiconductor material 10. In one embodiment, the at least one first semiconductor material 18 has a formula $Si_xGe_{1-x}$ wherein x is $0 \leq x \leq 1$. As such, the at least one first semiconductor material 18 may comprise Si (when x is 1), Ge (when x is 0), or a SiGe (when x is other than 1, or 0).

In some embodiments of the present application, the at least one first semiconductor material 18 can contain C therein. When present, C can be present in a concentration from 0 atomic % to 50 atomic %. In some embodiments, the at least one first semiconductor material 18 can contain from 0 atomic % to 25 atomic % carbon therein. The carbon impurity can be added by way of either a source gas that includes carbon, or by introducing a carbon source gas into the gas mixture that is employed in the present application for forming the at least one first semiconductor material 18.

In some embodiments of the present application, the at least one first semiconductor material 18 may include nitrogen, oxygen, fluorine, deuterium, chlorine or any combination thereof. When present, the concentration of the aforementioned species can be from 1 atomic % to 10 atomic %. Other concentrations that are lesser than, or greater than, the aforementioned concentration range can also be present.

When at least one of the semiconductor material layers of the least one first semiconductor material 18 is doped, the dopant that is contained within the at least one semiconductor material layers can be a p-type dopant or an n-type dopant. The dopant within each semiconductor layer of the at least one semiconductor material 18 can be uniformly present or present as a gradient. In a Si-containing doped semiconductor material examples of p-type dopants, i.e., impurities, include but are not limited to, boron, aluminum, gallium and indium. In one embodiment, in which at least one of semiconductor material layers of the at least one first semiconductor material 18 includes a p-type dopant, the p-type dopant is present in a concentration ranging from $10^{16}$ atoms/cm³ to $10^{21}$ atoms/cm³. In another embodiment, in which at least one of semiconductor material layers of the at least one first semiconductor material 18 contains a p-type dopant, the p-type dopant is present in a concentration ranging from $10^{18}$ atoms/cm³ to $5\times10^{20}$ atoms/cm³.

In a Si-containing doped semiconductor material, examples of n-type dopants, i.e., impurities, include but are not limited to, antimony, arsenic and phosphorous. In one embodiment, in which at least one of semiconductor material layers of the at least one first semiconductor material 18 contains an n-type dopant, the n-type dopant is present in a concentration ranging from $10^{16}$ atoms/cm³ to $10^{21}$ atoms/cm³. In another embodiment, in which the at least one of semiconductor material layers of the at least one first semiconductor material 18 contains an n-type dopant, the n-type dopant is present in a concentration ranging from $10^{18}$ atoms/cm³ to $5\times10^{20}$ atoms/cm³.

In one embodiment, the at least one first semiconductor material 18 can be formed by plasma enhanced chemical vapor deposition (PECVD). PECVD is a deposition process used to deposit films from a gas state (vapor) to a solid state on a deposition substrate. Chemical reactions are involved in the process, which occur after creation of a plasma of the reacting gases. A plasma is any gas in which a significant percentage of the atoms or molecules are ionized. Fractional ionization in plasmas used for deposition and related materials processing varies from about $10^{-4}$ in capacitive discharge plasmas to as high as 5-10% in high density inductive plasmas. Processing plasmas are typically operated at pressures of a few millitorr to a few torr, although arc discharges and inductive plasmas can be ignited at atmospheric pressure. In some embodiments, the plasma is created by RF (AC) frequency, such as a radio frequency induced glow charge, or D discharge between two electrodes, the space between which is filled with the reacting gases. In one example, a PECVD device employs a parallel plate chamber configuration. In other embodiments, a hot-wire chemical vapor deposition (HWCVD) process can be used in forming the at least one first semiconductor material 18. In yet another embodiment, sputtering can be used in forming the at least one first semiconductor material 18.

In some embodiments, the at least one first semiconductor material 18 can be formed at a temperature close to 200° C., with highest quality films typically grown at temperatures in the range of 150° C.-250° C., however temperatures in the range from room-temperature (i.e., 20° C.) up to 450° C. may be used.

In other embodiments in which the at least one first semiconductor material 18 includes a semiconductor material comprising crystalline semiconductor portions and adjoining non-crystalline semiconductor portions, the semiconductor material, which includes the crystalline semiconductor portions and adjoining non-crystalline semiconductor portions, can be epitaxially grown at a temperature of less than 500° C. using a gas mixture that includes a source gas, optionally hydrogen and a dopant gas. The lower temperature limit for the epitaxial growth of such a semiconductor material is generally 100° C. In some embodiments, the semiconductor material, which includes the crystalline semiconductor portions and adjoining non-crystalline semiconductor portions, can be epitaxially grown at a temperature from 150° C. to 300° C. In other embodiments, the semiconductor material, which includes the crystalline semiconductor portions and adjoining non-crystalline semiconductor portions, can be epitaxially grown at a temperature from 150° C. to 250° C.

In one embodiment in which a semiconductor material, which includes crystalline semiconductor portions and adjoining non-crystalline semiconductor portions, is formed, such a layer can be formed by PECVD. In some embodiments, the pressure for the PECVD process that can be used for epitaxially growing the semiconductor material, which includes the crystalline semiconductor portions and adjoining non-crystalline semiconductor portions, can range from 10 mTorr to 5 Torr, and in one example may be in the range of 250 mtorr to 900 mTorr. The power density for the PECVD process for epitaxially growing the doped hydrogenated semiconductor material layer may range from 1 mW/cm$^2$ to 100 mW/cm$^2$, and in one example may be in the range of 3 mW/cm$^2$ to 10 mW/cm$^2$. Further details regarding the epitaxial growth process for forming the semiconductor material, which includes the crystalline semiconductor portions and adjoining non-crystalline semiconductor portions, of the present application are described in U.S. Patent Publication No. 2012/0210932, which is owned by the assignee of the present application, and is incorporated herein by reference.

In any of the methods mentioned above, the source gas that can be used to form the at least one first semiconductor material 18 may comprise a Si-containing precursor, such as, for example, a silane and a disilane and/or a germanium-containing precursor such as, for example, a germane, GeH$_4$. In some embodiments, Si-containing and Ge-containing precursors can be used in forming the doped hydrogenated semiconductor material layer. Other gases including a carbon source such, as for example, CH$_4$ may be used. In some embodiments, ammonia (NH$_3$), nitrous oxide (N$_2$O) or other gas sources may be used for nitrogen containing semiconductor material layers. Carbon dioxide (CO$_2$), N$_2$O or O$_2$ may be used to provide oxygen for oxygen containing semiconductor material layers. A carrier gas such as hydrogen (H$_2$), deuterium (D$_2$) helium (He) or argon (Ar) may be used for any or all of the layers. The carrier gas may be pre-mixed with the gas sources or flowed simultaneously with the gas source at the time of growth.

In one embodiment, a gas mixture including a ratio of hydrogen to source gas of from greater than 5:1 can be used. In another embodiment, the ratio of hydrogen to source gas that can be used ranges from 5:1 to 1000:1. For example, epitaxial growth of silicon is possible at temperatures as low as 150° C. with ratios of hydrogen to silane (SiH$_4$) ranging from 5:1 to 20:1.

The dopant gas that can be present during the formation of at least one semiconductor material layer within the at least one first semiconductor material 18 provides the conductivity type, either n-type or p-type, to the at least one semiconductor material. When a doped semiconductor material layer of an n-type conductivity is to be formed, the dopant gas includes at least one n-type dopant, e.g., phosphorus or arsenic. For example, when phosphorus is the n-type dopant, the dopant gas can be phosphine (PH$_3$), and when arsenic is the n-type dopant, the dopant gas can be arsine (AsH$_3$). In one example, when the conductivity type dopant is n-type, the dopant gas include phosphine gas (PH$_3$) present in a ratio to silane (SiH$_4$) ranging from 0.01% to 10%. In another example, when the conductivity type dopant is n-type, the dopant gas include phosphine gas (PH$_3$) present in a ratio to silane (SiH$_4$) ranging from 0.1% to 2%. When a semiconductor material layer of a p-type conductivity is to be formed, a dopant gas including at least one p-type dopant, e.g., B, is employed. For example, when boron is the p-type dopant, the dopant gas can be diborane (B$_2$H$_6$). In one embodiment, wherein the conductivity type dopant is p-type, the dopant gas may be diborane (B$_2$H$_6$) present in a ratio to silane (SiH$_4$) ranging from 0.01% to 10%. In another embodiment, wherein the conductivity type dopant is p-type, the dopant gas may be diborane (B$_2$H$_6$) present in a ratio to silane (SiH$_4$) ranging from 0.1% to 2%. In yet another embodiment, in which the conductivity type dopant is p-type, the dopant gas for may be trimethylboron (TMB) present in a ratio to silane (SiH$_4$) ranging from 0.1% to 10%.

Examples of the semiconducting material layers that can be used as the at least one first semiconductor material 18 include, but not limited to, a-Si:H, a-Ge:H, a-SiGe:H, a-SiC:H, a-SiO:H, a-SiN:H, nc-Si:H, nc-Ge:H, nc-SiGe:H, nc-SiC:H, nc-SiO:H, nc-SiN:H, μc-Si:H, μc-Ge:H, μc-SiGe:H, μc-SiC:H, μc-SiO:H, μc-SiN:H or combinations thereof; nc- and μc- stand for nano-crystalline and micro-crystalline, respectively, "a" stands for amorphous, and "H" stands for hydrogenated.

Figure 5:
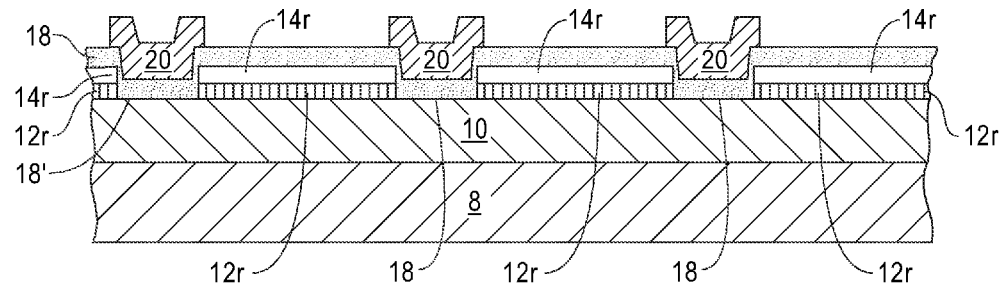
FIG. 5 is a pictorial representation (through a cross sectional view) illustrating the structure of FIG. 4 after forming first electrode material portions on uppermost surfaces of the at least one first semiconductor material and atop each first contact opening.

Referring now to FIG. 5, there is illustrated the structure of FIG. 4 after forming first electrode material portions 20 on an uppermost surface of the at least one first semiconductor material 18 and atop each first contact opening 16. Each first electrode material portion 20 can be comprised of a conductive material including, for example, a doped Si-containing material, a conductive metal, a conductive metal alloy comprising at least two conductive metals, a conductive metal nitride, a transparent conductive oxide and/or a conductive metal silicide. Examples of conductive metals that can be used include, for example, Cu, W, Pt, Al, Pd, Ru, Ni, and/or Ir. In some embodiments, each first electrode portion 20 is comprised of a same conductive material. In another embodiment, a first set of first electrode material portions 20 may comprise a first conductive material, while a second set of first electrode material portions 20 may comprise a second conductive material that differs from the first conductive material. Each first electrode material portion 20 can have a thickness from 1 nm to 1000 nm. Other thicknesses that are lesser than, or greater than, the aforementioned thickness range can also be employed as the thickness for each first electrode material portion 20.

In some embodiments, each first electrode material portion 20 can be formed using a deposition process including, for example, chemical vapor deposition, plasma enhanced chemical vapor deposition, sputtering, chemical solution deposition, or plating. Metal silicides can be formed utilizing any conventional silicidation process that is well known to those skilled in the art. In some embodiments, the conductive material can be patterned by lithography and etching as described hereinabove. In some embodiments, block mask technology can be used to form first electrode material portions 20 that contain different conductive materials.

Figure 6:
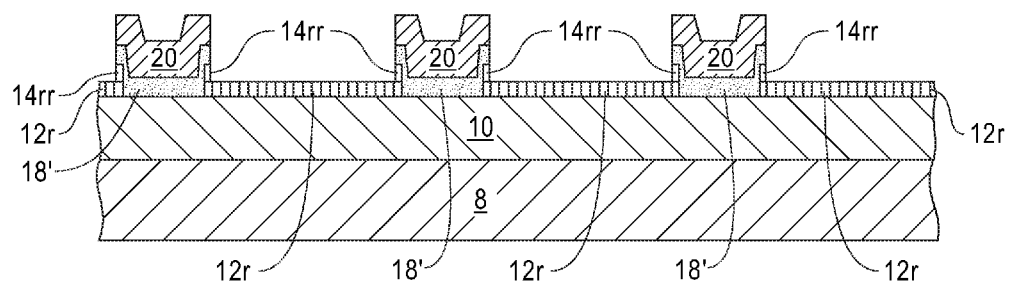
FIG. 6 is a pictorial representation (through a cross sectional view) illustrating the structure of FIG. 5 after removing exposed portions of the at least one first semiconductor material and remaining portions of the blanket layer of sacrificial material using each first electrode material portion as an etch mask.

Referring now to FIG. 6, there is illustrated the structure of FIG. 5 after removing exposed portions of the at least one first semiconductor material 18 and remaining portions of the blanket layer of sacrificial material (i.e., first sacrificial material layer portions 14r) using each first electrode material portion 20 as an etch mask. In the drawing, each remaining portion of the at least first semiconductor material 18 can be referred to as first semiconductor material contact 18'. As shown, some of the original sacrificial material remains between a portion of each first electrode material portion 20 and each first semiconductor material contact 18'. Each portion of the original sacrificial material that remains can be referred to herein as a second sacrificial material layer portion 14rr.

In one embodiment, the exposed portions of the at least one first semiconductor material 18 and underlying remaining portions of the blanket layer of sacrificial material (i.e, first sacrificial material layer portions 14r) which are not protected by a first electrode material portion 20, can be removed utilizing a single etch. In another embodiment, two separate etching steps can be used to remove the exposed portions of the at least one first semiconductor material 18 and underlying remaining portions of the blanket layer of sacrificial material (i.e., first sacrificial material layer portions 14r) which are not protected by a first electrode material portion 20.

The etch or etches that can be used in this step of the present application may include for example, a dry etch process such as, for example, reactive ion etching, plasma etching or ion beam etching. Alternatively, a chemical wet etch can be employed. In one embodiment, the exposed portions of the at least one first semiconductor material 18 and underlying remaining portions of the blanket layer of sacrificial material (i.e., the first sacrificial material layer portions 14r) which are not protected by a first electrode material portion 20 can be removed by $SF_6$, $SF_6/O_2$ or $Cl_2F_2/O_2$ plasma.

Figure 7:
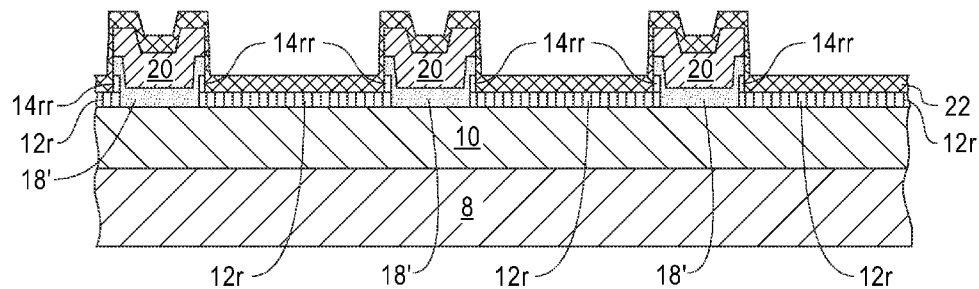
FIG. 7 is a pictorial representation (through a cross sectional view) illustrating the structure of FIG. 6 after forming another blanket layer of sacrificial material on exposed surfaces of remaining portions of the blanket layer of passivation material and each first electrode material portion.

Referring now to FIG. 7, there is illustrated the structure of FIG. 6 after forming another blanket layer of sacrificial material 22 on exposed surfaces of the remaining portions of the blanket layer of passivation material (i.e., first passivation material layer portions 12r) and each first electrode material portion 20. The another blanket layer of passivation material 22 can also be referred to herein as a second blanket layer of second sacrificial material. The another blanket layer of sacrificial material 22 can include one of the semiconductor materials mentioned above for the blanket layer of sacrificial material 14. Also, one of the techniques mentioned above in forming the blanket layer of sacrificial material 14 can also be used in forming the another blanket layer of sacrificial material 22.

Figure 8:
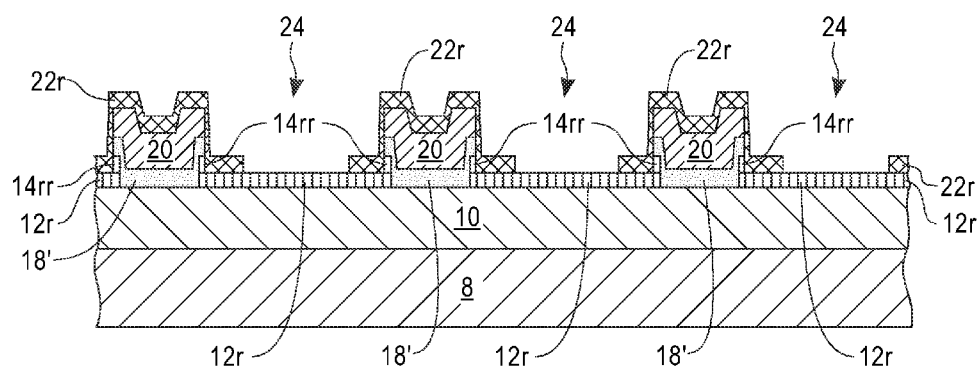
FIG. 8 is a pictorial representation (through a cross sectional view) illustrating the structure of FIG. 7 after patterning the another blanket layer of sacrificial material to include second contact openings that expose different surface portions of remaining passivation material layer portions.

Referring now to FIG. 8, there is illustrated the structure of FIG. 7 after patterning the another blanket layer of sacrificial material 22 to include second contact openings 24 that expose surface portions of the first passivation material layer portions 12r. The remaining portions of the another blanket layer of sacrificial material 22 can be referred to herein as other sacrificial material layer portions 22r. The patterning of the another blanket layer of sacrificial material to include second contact openings 24 includes the same technique as mentioned above in patterning the blanket layer of sacrificial material 14 to include first contact openings 16. Each second contact opening 24 can have a dimension, i.e., width, within the range mentioned above for the first contact openings 16. The number of second contact openings 24 that are formed varies and is dependent on the type and number of semiconductor devices that are to be subsequently formed on different surface portions of the crystalline semiconductor material 10. In one embodiment, and as illustrated in the drawings, three second contact openings 24 are formed.

Figure 9:
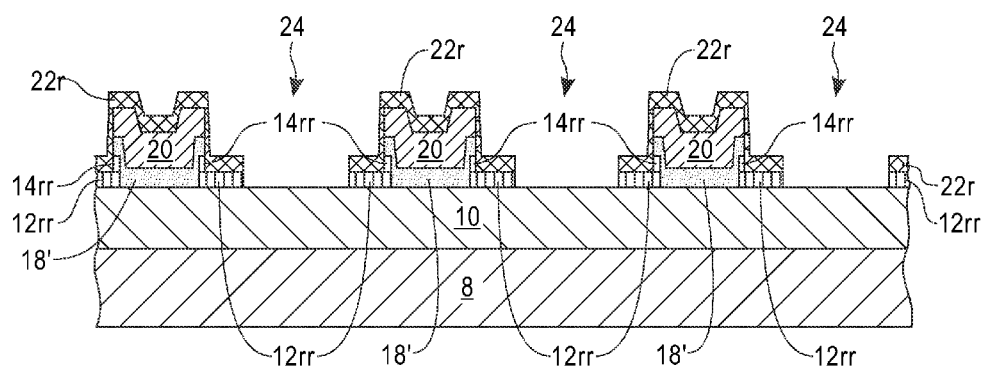
FIG. 9 is a pictorial representation (through a cross sectional view) illustrating the structure of FIG. 8 after transferring the second contact openings into the exposed remaining passivation material layer portions using the remaining portions of the another blanket layer of sacrificial material as an etch mask, wherein after the transferring of the second contact openings, second surface portions of the crystalline semiconductor material are exposed.

Referring now to FIG. 9, there is illustrated the structure of FIG. 8 after transferring each second contact opening 24 into remaining first passivation material layer portions 12r using remaining portions of the another blanket layer of sacrificial material (i.e., the other sacrificial material layer portions 22r) as an etch mask. The pattern transfer of each second contact opening 24 can be performed utilizing the same techniques (i.e., etching) as mentioned above in transferring each first contact opening 16 into the blanket layer of passivation material 12. After the transferring of each second contact opening 24, second surface portions of the crystalline semiconductor material 10 are exposed. In the drawings, each reference numeral 12a denotes a second remaining passivation material layer portion that can form after exposing each second surface portion of the crystalline semiconductor material 10.

Figure 10:
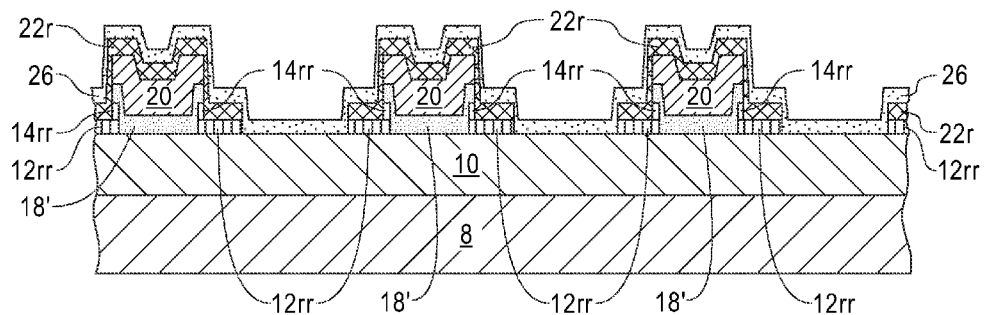
FIG. 10 is a pictorial representation (through a cross sectional view) illustrating the structure of FIG. 9 after forming at least one second semiconductor material on each second surface portion of the crystalline semiconductor material and atop remaining portions of the other blanket layer of sacrificial material.

Referring now to FIG. 10, there is illustrated the structure of FIG. 9 after forming at least one second semiconductor material 26 on each second surface portion of the crystalline semiconductor material 10 and atop remaining portions of the other blanket layer of sacrificial material 22r. The second semiconductor material 26 that can be employed in the present application can include the same or different semiconductor material(s) and, any of the various embodiments, mentioned above for the first semiconductor material 18 as long as the conductivity of the second semiconductor material is opposite from the conductivity type used as the first semiconductor material 18. Hence, the first semiconductor material 18 can be used as n-type or p-type semiconductor contacts, while the second semiconductor material 26 can be used as the other of p-type or n-type semiconductor contacts not used as the contact that includes the first semiconductor material 18.

Figure 11:
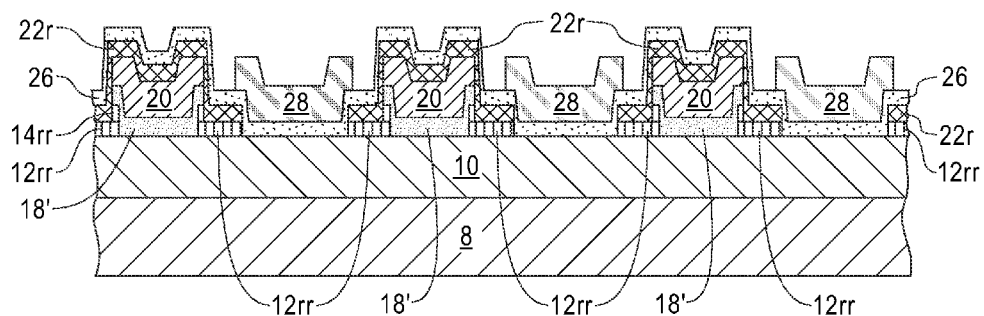
FIG. 11 is a pictorial representation (through a cross sectional view) illustrating the structure of FIG. 10 after forming second electrode material portions on surface portions of the second semiconductor material and atop each second contact opening.

Referring now to FIG. 11, there is illustrated the structure of FIG. 10 after forming second electrode material portions 28 on different portions of the at least one second semiconductor material 26 and atop each second contact opening 24. Each second electrode material portion 28 may comprise one of the conductive materials mentioned above for the first electrode material portions 20. Also, one of the techniques mentioned above in forming the first electrode material portions 20 can also be used here for forming each second electrode material portion 28.

Figure 12:
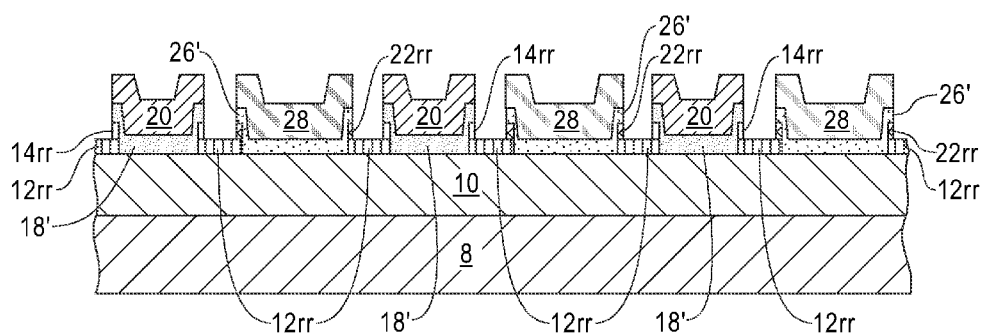
FIG. 12 is a pictorial representation (through a cross sectional view) illustrating the structure of FIG. 11 after removing exposed portions of the at least one second semiconductor material and remaining portions of the other blanket layer of sacrificial material using each second electrode material portion as an etch mask.

Referring now to FIG. 12, there is illustrated the structure of FIG. 11 after removing exposed portions of the at least one second semiconductor material 26 and remaining portions of the other blanket layer of sacrificial material (i.e., other sacrificial material layer portions 22r) using each second electrode material portion 28 as an etch mask. In the drawing, each remaining portion of the at least one second semiconductor material 26 can be referred to as a second semiconductor material contact 26'. As shown, some of the other sacrificial material 22 remains between a portion of each second electrode material portion 28 and each second semiconductor material contact 26'. This portion of the other sacrificial material layer that remains can be referred to herein as a second other sacrificial material layer portion 22a.

In one embodiment, the exposed portions of the at least one second semiconductor material 26 and remaining portions of the blanket layer of other sacrificial material which are not protected by the second electrode material portions 28, can be removed utilizing a single etch. In another embodiment, two separate etching steps can be used at this point of the present application. The etch or etches that can be used in this step of the present application may include for example, a dry etch process such as, for example, reactive ion etching, plasma etching or ion beam etching. Alternatively, a chemical wet etch can be employed. In one embodiment, an etch using $SF_6$, $SF_6/O_2$ or $Cl_2F_2/O_2$ plasma can be used.

It is noted that within FIG. 12, the remaining sacrificial material layer portions 14rr is located between an outer portion of each first semiconductor material contact 18' and upper surfaces of the passivation material layer portions 12rr. Also, the vertical edges of the elements 14a, 18' and 20 are coincident with each other. It is noted that within FIG. 12, the remaining other sacrificial material 22a is located between an outer portion of each second semiconductor material contact 26' and upper surfaces of the passivation material layer portions 12a. Also, the vertical edges of the elements 22a, 26' and 28 are coincident with each other.

Figure 13:
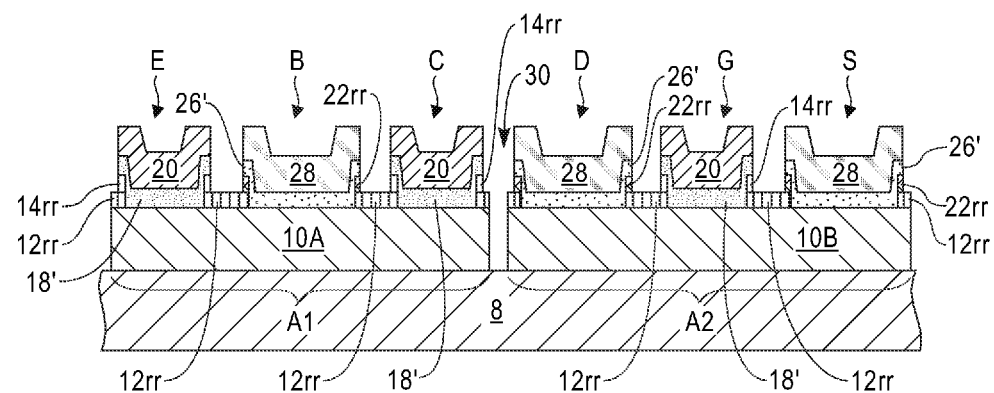
FIG. 13 is a pictorial representation (through a cross sectional view) illustrating the structure of FIG. 12 after defining active regions in the crystalline semiconductor material.

Referring now FIG. 13, there is illustrated the structure of FIG. 12 after defining active regions in the crystalline semiconductor material 10. Each active region includes a crystalline semiconductor material portion which is derived from crystalline semiconductor material 10. As such, each crystalline semiconductor material portion is composed of the same crystalline semiconductor material as crystalline semiconductor material 10. In the drawing, a first crystalline semiconductor material portion 10A is present in a first active region A1 and a second crystalline semiconductor material portion 10B is present in a second active region A2. As is shown, a gap 30 is located between a sidewall surface of the first active region A1 and a sidewall surface of the second active region A2. The active regions A1, A2 can be formed by lithography and etching. As shown, the gap 30 exposes a surface of the underlying insulator layer 8. Although two active regions are disclosed and illustrated, the number of active regions is not limited to only two active regions. Instead, any number first active regions A1, and any number of second active regions A2 can be formed. The shape of the active regions can vary. Examples shapes for the active regions includes square, rectangular, circular, etc.

Notably, FIG. 13 illustrates an exemplary semiconductor structure of the present application which includes a first active region A1 comprising a first crystalline semiconductor portion 10A of a first conductivity type located on one portion of a surface of an insulator layer 8, and a second active region A2 comprising a second crystalline semiconductor portion 10B of the first conductivity type located on another portion of the insulator layer 8, wherein the second active region A2 is laterally spaced apart from the first active region A1 by gap 30. The structure further includes a bipolar junction transistor (BJT) located within the first active region 10A and comprising an emitter, E, of a second conductivity type, a base, B, of the first conductivity type and a collector, C, of the second conductivity type, wherein the base, B, is located between, and laterally spaced apart from, the emitter, E, and the collector, C. The structure also includes a junction field effect transistor (JFET) located within the second active region 10B and comprising a drain, D, of the first conductivity type, a gate, G, of the second conductivity type, and a source, S of the first conductivity type, wherein the gate, G, is located between, and laterally spaced apart from, the drain, D, and the source, S. In accordance with the present application, the second conductivity type is opposite the first conductivity type. It should be noted that although the drawings show the emitter to the left of the base, and the drain to the left of the gate, the present application also contemplates structures in which the emitter is to the right of the base, and the drain is to the right of the gate. It should also be noted that while the drawings illustrate one BJT and one JFET located on the same crystalline semiconductor material, the semiconductor structure of the present application is not limited to only one BJT and one JFET. Instead, any number of BJTs and any number of JFETs can be formed.

In the illustrated embodiment, the emitter, the collector and the gate each include the first semiconductor material contact 18', while the base, the source and the drain include each the second semiconductor material contact 26'. In accordance with an embodiment of the present application, and when the crystalline semiconductor material is p-type, then the emitter, the collector and the gate each include an n-type semiconductor material, while the base, the drain and the source each include a p-type semiconductor material. In another embodiment of the present application, and when the crystalline semiconductor material is n-type, then the emitter, the collector and the gate each include a p-type semiconductor material, while the base, the drain and the source each include an n-type semiconductor material.

The formation of the active regions can be performed earlier in the process flow as well. For example, the active regions A1, A2 can be formed into the crystalline semiconductor material 10 prior to forming the blanket layer of passivation material 12 on the crystalline semiconductor substrate 10. In some embodiments, the patterning of the crystalline semiconductor material 10 as a first step and defining JFETs gate widths larger than the active region width may be advantageous in improving the electrostatic control of the JFET gate. This is so because the JFET gate will be in contact with the active region not only from the top, but also from the two sidewall surfaces parallel to the plane of the drawings wherein the crystalline semiconductor material 10 has been patterned (assuming the crystalline semiconductor material 10 is patterned into square regions).

By way of illustration, an inverter circuit will now be formed using the structure shown in FIG. 13. Specifically, and referring to FIG. 14, there is illustrated the structure of FIG. 13 after formation of a first interconnect level 34 which includes first metal contacts. The first interconnect level 34 can be formed by first forming a layer of a dielectric material 35 on the entire structure shown in FIG. 13. The layer of dielectric material 35 can be composed of silicon oxide or a dielectric material having a dielectric constant that is lower than silicon oxide, such as, for example, an organosilicate compound that contains atoms of Si, C, O and H. Other dielectric materials besides those mentioned can also be employed. The layer of dielectric material 35 can be formed by a deposition process including, for example, chemical vapor deposition or plasma enhanced chemical vapor deposition. Following the deposition of the layer of dielectric material 35, the layer of dielectric material 35 can be patterned by lithography and etching to include first via openings that extend to upper surfaces of emitter, the collector, the drain and the source.

Figure 14:
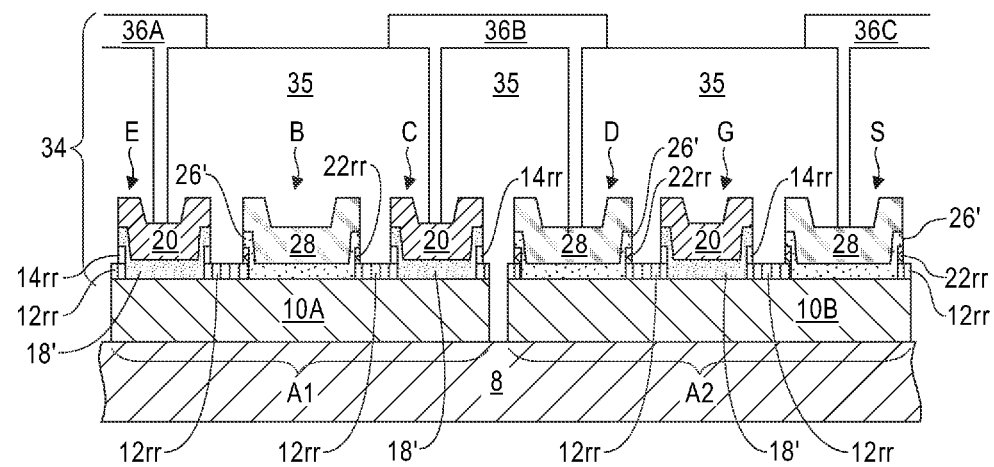
FIG. 14 is a pictorial representation (through a cross sectional view) illustrating the structure of FIG. 13 after formation of a first interconnect level containing first metal contacts.

After providing the first via openings into the layer of dielectric material 35, first metal contacts can be formed within each via opening. In FIG. 14, there is shown a first metal contact 36A to the emitter, a shared first metal contact 36B to the collector and the drain, and a first metal contact 36C to the source. The first metal contacts can be formed by deposition of a conductive metal and then the deposited conductive metal is patterned by lithography and etching. The deposition of the conductive metal can include, for example, chemical vapor deposition, plasma enhanced chemical vapor deposition, plating, or sputter. Examples of conductive metals that can be used in forming the first metal contacts include any of the conductive metals or metal alloys that are mentioned above for first conductive electrode portions 20.

Figure 15:
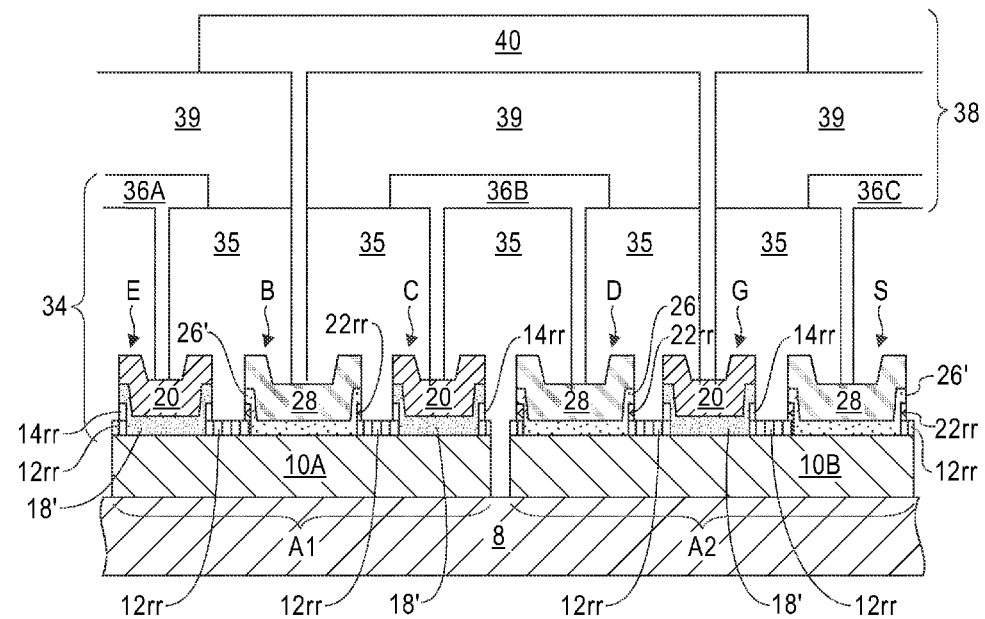
FIG. 15 is a pictorial representation (through a cross sectional view) illustrating the structure of FIG. 14 after formation of a second interconnect level containing second metal contacts.

Referring now to FIG. 15, there is illustrated the structure of FIG. 14 after formation of a second interconnect level 38 which includes a second metal contact. The second interconnect level includes another layer of dielectric material 39 which can be the same or different from layer of dielectric material 35 of the first interconnect level 34. The another layer of dielectric material 39 can be formed utilizing a deposition process, and then patterned by lithography and etching to include second via openings. The second via openings can extend down to the base and the gate. A second metal contact 40 can include one of the conductive metals mentioned above for the first conductive electrode portion 20, and the second metal contact 40 can be formed utilizing one of the deposition processes mentioned above for the first metal contacts. The resultant structure forms an inverter circuit which is schematically illustrated in FIGS. 28A-28B of the present application.

Reference is now made to FIGS. 16-27 which illustrate another embodiment of the present application in which a self aligned process is employed in forming an exemplary semiconductor structure in accordance with the present application, which can be used within various circuits such as an inverter circuit. Although an inverter circuit is described and illustrated, the same basic processing step can be used in forming other types of circuits including, but not limited to, a SRAM cell circuit, a pass transistor circuit, and an OLED driver circuit.

This embodiment of the present application includes the same basic processing steps as the first embodiment except that the at least one first semiconductor material 18 includes a semiconductor material that has crystalline portions 18C and adjoining non-crystalline portions 18NC, and that the at least one second semiconductor material 26 includes a semiconductor material that has crystalline portions 26C and adjoining non-crystalline portions 26NC.

Figure 16:
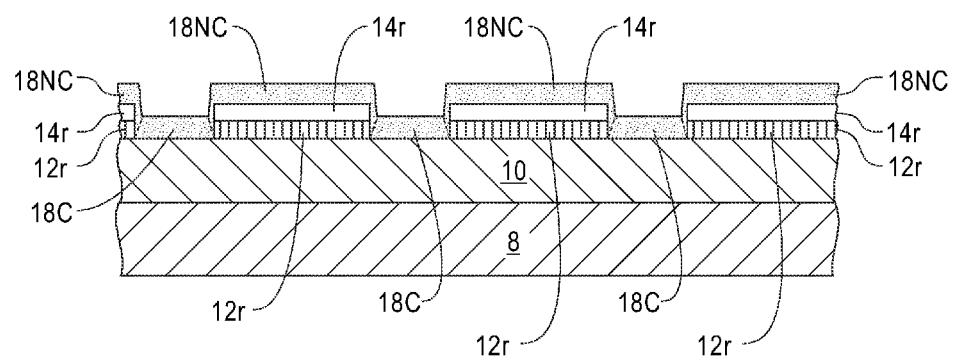
FIG. 16 is a pictorial representation (through a cross sectional view) illustrating the structure shown in FIG. 3 after forming at least a first semiconductor material comprising a crystalline semiconductor material portion and adjoining non-crystalline semiconductor material portions.

Referring first to FIG. 16, there is illustrated the structure shown in FIG. 3 after forming at least a first semiconductor material layer that comprises crystalline semiconductor material portions 18C and adjoining non-crystalline semiconductor material portions 18NC. As shown, each crystalline semiconductor portion 18C is located directly on an exposed first surface portion of the crystalline semiconductor material 10, while each non-crystalline semiconductor portion 18NC is formed on all other surfaces. Such a semiconductor material can be formed as described above in conjunction with an embodiment mentioned for forming the structure shown in FIG. 4. The first semiconductor material comprising the crystalline semiconductor material portions 18C and the adjoining non-crystalline semiconductor material portions 18NC can be hydrogenated or non-hydrogenated, and typically includes a dopant, as described in the first embodiment of the present application. In one embodiment, the first semiconductor material comprising the crystalline semiconductor material portions 18C and the adjoining non-crystalline semiconductor material portions 18NC may comprise a same conductivity type dopant as the crystalline semiconductor material 10. In another embodiment, the first semiconductor material comprising the crystalline semiconductor material portions 18C and the adjoining non-crystalline semiconductor material portions 18NC may comprise an opposite conductivity type dopant as the crystalline semiconductor material 10.

Figure 17:
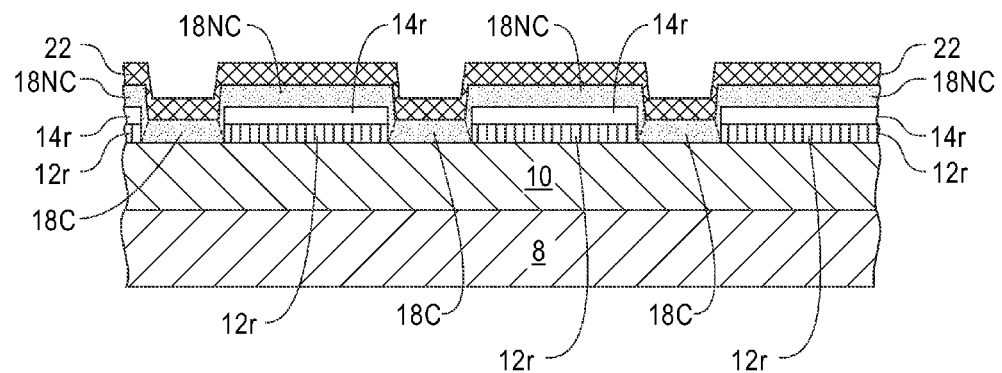
FIG. 17 is a pictorial representation (through a cross sectional view) illustrating the structure of FIG. 16 after forming another blanket layer of sacrificial material atop the first semiconductor material.

Referring now to FIG. 17, there is illustrated the structure of FIG. 16 after forming another blanket layer of sacrificial material 22 atop the first semiconductor material. The another blanket layer of sacrificial material 22 used in this embodiment of the present application is the same as that mentioned above in conjunction with forming the structure shown in FIG. 7 of the first embodiment of the present application. Note that no separate electrode material portions, i.e., first electrode material portions 20, need to be formed within this embodiment of the present application. As such, the processing sequence is reduced as compared to the processing sequence described above in the first embodiment of the present application.

Figure 18:
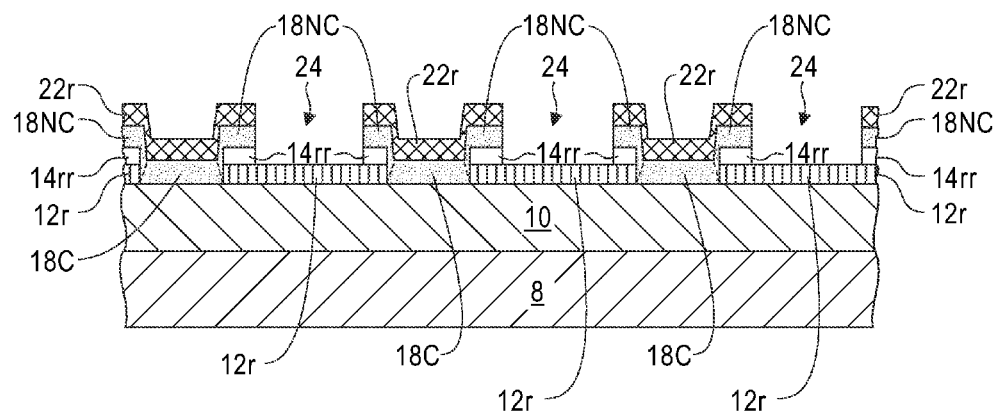
FIG. 18 is a pictorial representation (through a cross sectional view) illustrating the structure of FIG. 17 after forming second contact openings within portions of the another blanket layer of sacrificial material, portions of the non-crystalline semiconductor material portions of the first semiconductor material, and remaining portions of the sacrificial material layer portions, wherein each second contact opening exposes a surface of the remaining passivation material layer portions.

Referring now to FIG. 18, there is illustrated the structure of FIG. 17 after forming second contact openings 24 within portions of the another blanket layer of sacrificial material 22, portions of the non-crystalline semiconductor material portions 18NC of the first semiconductor material, and within remaining portions of the sacrificial material 14r, wherein each second contact opening 24 exposes a surface of one of the remaining passivation material layer portions 12r. Each second contact opening 24 can be formed by lithography and etching as described above in conjunction with providing the second contact openings 24 within FIG. 8 of the first embodiment of the present application. In this drawing, 14a denotes another remaining portion of the sacrificial material layer 14 that is formed.

Figure 19:
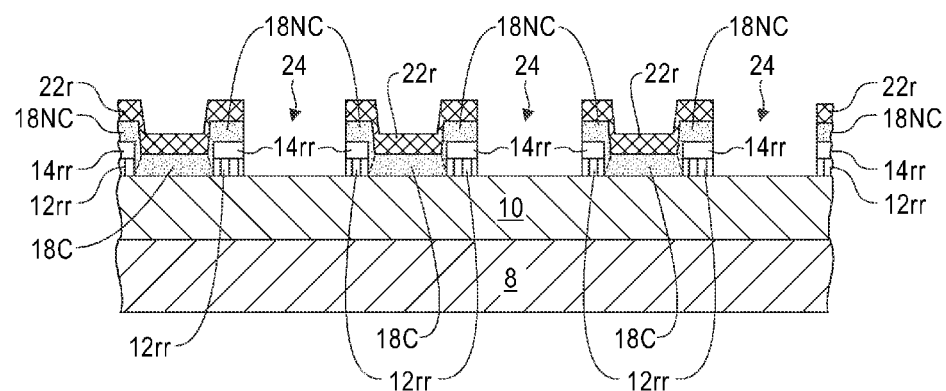
FIG. 19 is a pictorial representation (through a cross sectional view) illustrating the structure of FIG. 18 after transferring the second contact openings to the exposed remaining passivation material layer portions, wherein after the transferring of the second contact openings, second surface portions of the crystalline semiconductor material are exposed.

Referring now to FIG. 19, there is illustrated the structure of FIG. 18 after transferring each second contact opening 24 to the exposed passivation material layer portion 12r, wherein after the transferring of each second contact opening 24, second surface portions of the crystalline semiconductor material 10 are exposed. The transferring of each second contact opening 24 into the remaining passivation material layer portions (e.g., 12r) includes the same etch or etches as described above in conjunction with providing the structure shown in FIG. 9 of the first embodiment of the present application. In this drawing, 12a denotes another remaining portion of passivation material layer 12.

Figure 20:
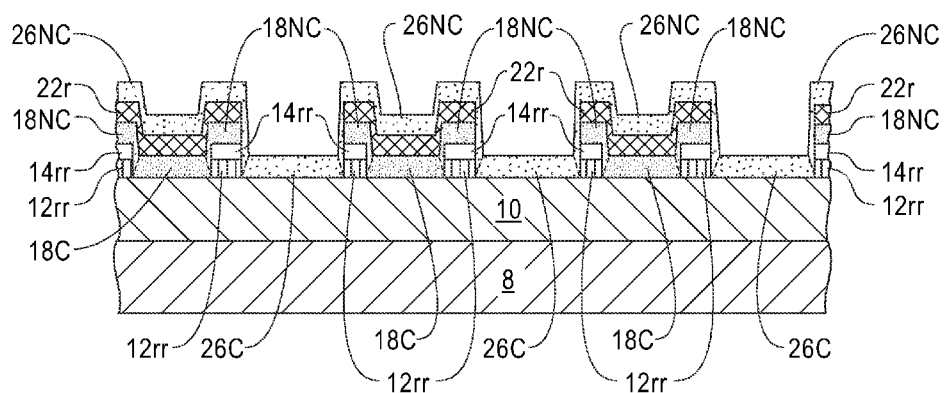
FIG. 20 is a pictorial representation (through a cross sectional view) illustrating the structure of FIG. 19 after forming at least a second semiconductor material on the second surface portions of the crystalline semiconductor material and remaining portions of the another blanket layer of sacrificial material, wherein the second semiconductor material includes second crystalline semiconductor material portions and adjoining non-crystalline semiconductor portions.

Referring now to FIG. 20, there is illustrated the structure of FIG. 19 after forming at least a second semiconductor material on each exposed second surface portion of the crystalline semiconductor material 10 and atop remaining portions of the another blanket layer of sacrificial material 22r, wherein the second semiconductor material includes second crystalline semiconductor material portions 26C and adjoining non-crystalline semiconductor portions 26NC. As shown, each crystalline semiconductor portion 26C is located directly on each exposed second surface portion of the crystalline semiconductor material 10, while each non-crystalline semiconductor portions 26NC is formed on all other surfaces. Such a semiconductor material can be formed as described above in conjunction with an embodiment described for forming the structure shown in FIG. 10. The second semiconductor material comprising the crystalline semiconductor material portions 26C and the adjoining non-crystalline semiconductor material portions 26NC can be hydrogenated or non-hydrogenated, and typically includes a dopant, as described in the first embodiment of the present application. In this embodiment, the second semiconductor material comprising the crystalline semiconductor material portions 26C and the adjoining non-crystalline semiconductor material portions 26NC comprise a different conductivity type dopant as compared to the first semiconductor material comprising the crystalline semiconductor material portions 18C and the adjoining non-crystalline semiconductor material portions 18NC.

Figure 21:
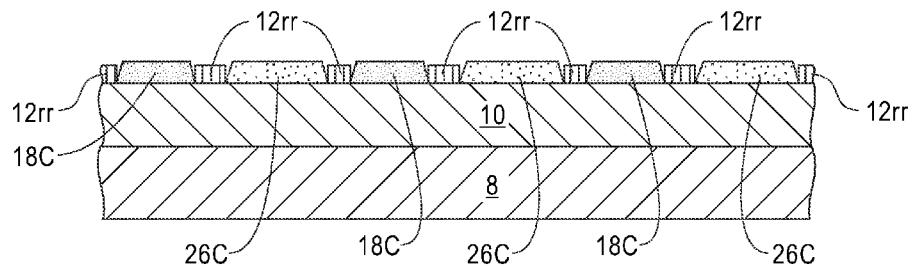
FIG. 21 is a pictorial representation (through a cross sectional view) illustrating the structure of FIG. 20 after performing an etch.

Referring to FIG. 21, there is illustrated the structure shown in FIG. 20 after performing an etch. The etch removes non-crystalline semiconductor portions 26NC, all remaining portions of the other blanket layer of sacrificial material 22r, non-crystalline semiconductor portions 18NC, and all remaining portions of the blanket layer of sacrificial material 14rr. The etch used in providing the structure shown in FIG. 25 includes an etch process which selectively removes non-crystalline layers (without removing or negligibly removing the crystalline layers). Each crystalline semiconductor portion 18C, 26C which remains represent a first semiconductor material contact and a second semiconductor material contact, respectively.

An example of such an etch process is disclosed, for example, in U.S. Patent Publication No. 2012/0210932, the entire content of which is incorporated herein by reference. In one embodiment, this etch process is performed in-situ. A non-limiting example of such an etch process which can be used in removing non-crystalline semiconductor materials selective to crystalline semiconductor material is etching by hydrogen plasma.

Figure 22:
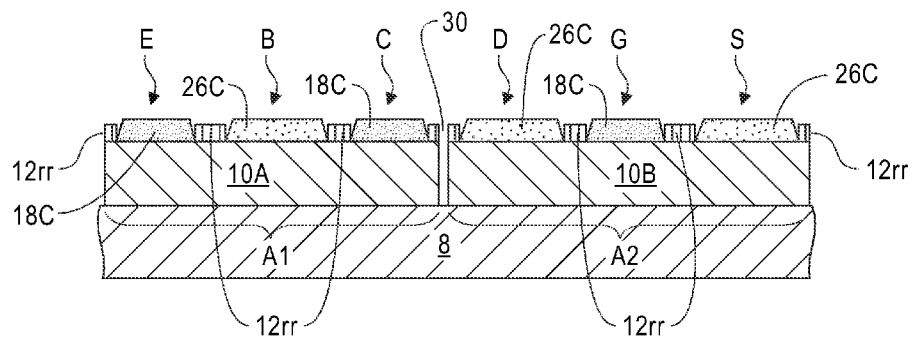
FIG. 22 is a pictorial representation (through a cross sectional view) illustrating the structure of FIG. 23 after forming active regions in the crystalline semiconductor material.

Referring now to FIG. 22, there is illustrated the structure of FIG. 21 after forming active regions in the crystalline semiconductor material 10. Each active region includes a crystalline semiconductor material portion which is derived from crystalline semiconductor material 10. As such, each crystalline semiconductor material portion is composed of the same crystalline semiconductor material as crystalline semiconductor material 10. In the drawing, a first crystalline semiconductor material portion 10A is present in first active region A1 and a second crystalline semiconductor material portion 10B is present in second active region A2. As is shown, a gap 30 is located between a sidewall surface of first active region A1 and a sidewall surface of second active region A2. The active regions can be formed by lithography and etching. As shown, the gap 30 exposes a surface of the underlying insulator layer 8. As was the case in the first embodiment, the number of active regions is not limited to two.

Notably, FIG. 22 illustrates an exemplary semiconductor structure of the present application which includes a first active region A1 comprising a first crystalline semiconductor portion 10A of a first conductivity type located on one portion of a surface of an insulator layer 8, and a second active region A2 comprising a second crystalline semiconductor portion 10B of the first conductivity type located on another portion of the insulator layer 8, wherein the second active region A2 is laterally spaced apart from the first active region A1 by gap 30. The structure further includes a bipolar junction transistor (BJT) located within the first active region 10A and comprising an emitter, E, of a second conductivity type, a base, B, of the first conductivity type and a collector, C, of the second conductivity type, wherein the base, B, is located between, and laterally spaced apart from, the emitter, E, and the collector, C. The structure also includes a junction field effect transistor (JFET) located within the second active region A2 and comprising a drain, D, of the first conductivity type, a gate, G, of the second conductivity type, and a source, S, of the first conductivity type, wherein the gate, G, is located between, and laterally spaced apart from, the drain, D, and the source, S. In accordance with the present application, the second conductivity type is opposite the first conductivity type.

In the illustrated embodiment, the emitter, the collector and the gate each include a first crystalline semiconductor portion 18C as a semiconductor material contact, while the base, the source and the drain each include a second crystalline semiconductor material portion 26C as a semiconductor material contact. In accordance with an embodiment of the present application, and when the crystalline semiconductor material is p-type, then the emitter, the collector, and the gate, each include an n-type semiconductor material, while the base, the drain, and the source each include a p-type semiconductor material. In another embodiment of the present application, and when the crystalline semiconductor material is n-type, then the emitter, the collector and the gate each include a p-type semiconductor material, while the base, the drain and the source each include an n-type semiconductor material.

The formation of the active regions can be performed earlier in the process flow as well. For example, the active regions A1, A2 can be formed into the crystalline semiconductor material 10 prior to forming the blanket layer of passivation material 12 on the crystalline semiconductor substrate 10. In some embodiments, the patterning of the crystalline semiconductor material 10 as a first step and defining JFETs gate widths larger than the active region width may be advantageous in improving the electrostatic control of the JFET gate. This is so because the JFET gate will be in contact with the active region not only from the top, but also from the two sidewall surfaces parallel to the plane of the drawings wherein the crystalline semiconductor material 10 has been patterned (assuming the crystalline semiconductor material 10 is patterned into square regions).

Figure 23:
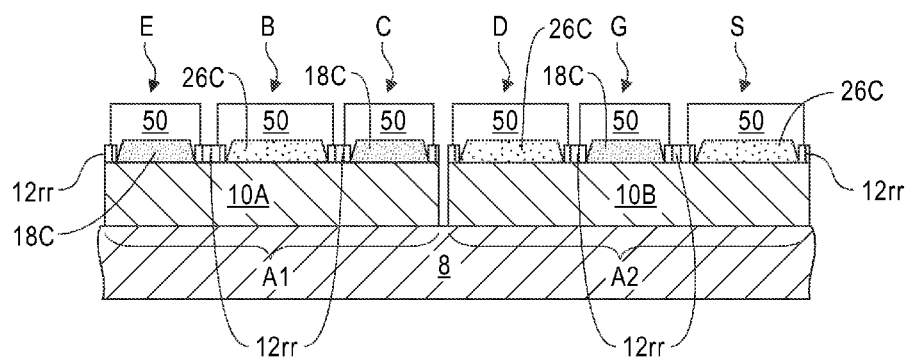
FIG. 23 is a pictorial representation (through a cross sectional view) illustrating the structure of FIG. 22 after forming electrode material portions on each portion of the first crystalline semiconductor material and the second crystalline semiconductor material.

By way of illustration and inverter circuit will now be formed using the structure shown in FIG. 22. Referring first to FIG. 23, there is illustrated the structure of FIG. 22 after forming electrode material portions 50 on each crystalline semiconductor portion 18C, 26C. Electrode material portion 50 includes one of the conductive materials mentioned above for the first electrode material portion 20, and it can also be formed utilizing one of the techniques mentioned above in forming the first electrode material portions 20.

Figure 24:
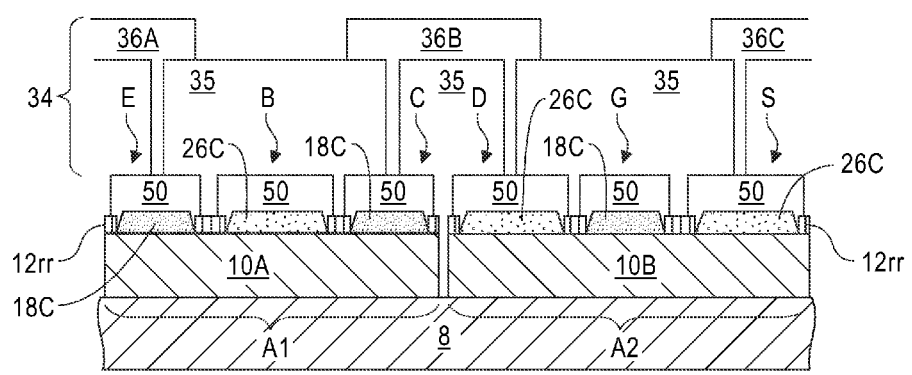
FIG. 24 is a pictorial representation (through a cross sectional view) illustrating the structure of FIG. 23 after formation of a first interconnect level containing first metal contacts.

Referring now to FIG. 24, there is illustrated the structure of FIG. 23 after formation of a first interconnect level 34 containing first metal contacts in accordance with one embodiment of the present application. The first interconnect level 34 of this embodiment can be formed as described above in FIG. 14 of the present application. The first interconnect level 34 also includes a dielectric material 35 (as also described above in connection with providing the structure shown in FIG. 18 of the present application). Also, the structure shown in FIG. 24 includes a first metal contact 36A to the emitter E, a shared first metal contact 36B to the collector, C, and the drain, D, and a first metal contact 36C to the source, S. The first metal contacts can be formed and contain conductive metals as mentioned above in connection with providing the structure shown in FIG. 14.

Figure 25:
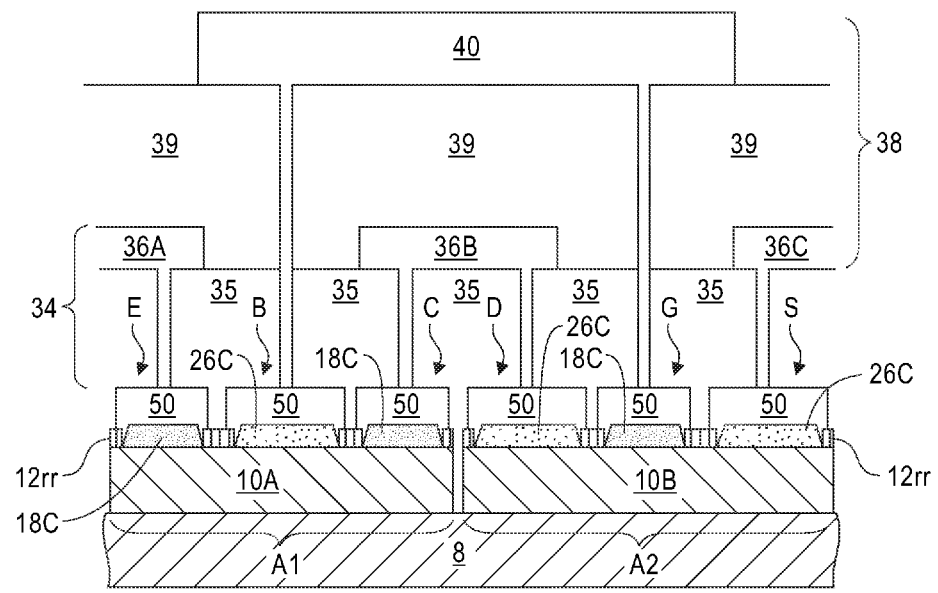
FIG. 25 is a pictorial representation (through a cross sectional view) illustrating the structure of FIG. 24 after formation of a second interconnect level containing second metal contacts.

Referring now to FIG. 25, there is illustrated the structure of FIG. 24 after formation of a second interconnect level 38 containing second metal contacts. The second interconnect level 38 includes another layer of dielectric material 39 which can be the same or different from layer of dielectric material 35 of the first interconnect level 34. The another layer of dielectric material 39 can be formed utilizing a deposition process, and then patterned by lithography and etching to include second via openings. The second via openings can extend down to the base, B and the gate, G. A second metal contact 40 can include one of the conductive metals mentioned above for the first conductive electrode, and the second metal contact 40 can be formed utilizing one of the deposition processes mentioned above for the first metal contacts. The structure shown in FIG. 25 represents an inverter circuit of the present application which is schematically shown in FIGS. 28A-28B of the present application.

Figure 26:
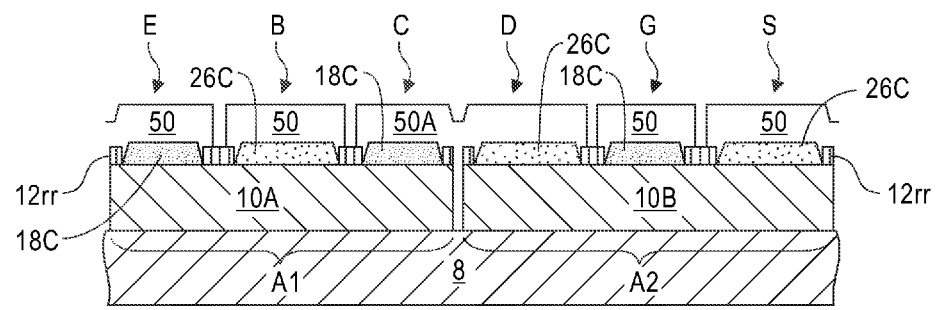
FIG. 26 is a pictorial representation (through a cross sectional view) illustrating the structure of FIG. 22 after formation of electrode material portions on each portion of the first crystalline semiconductor material and the second crystalline semiconductor material in accordance with another embodiment of the present application.
Figure 31:
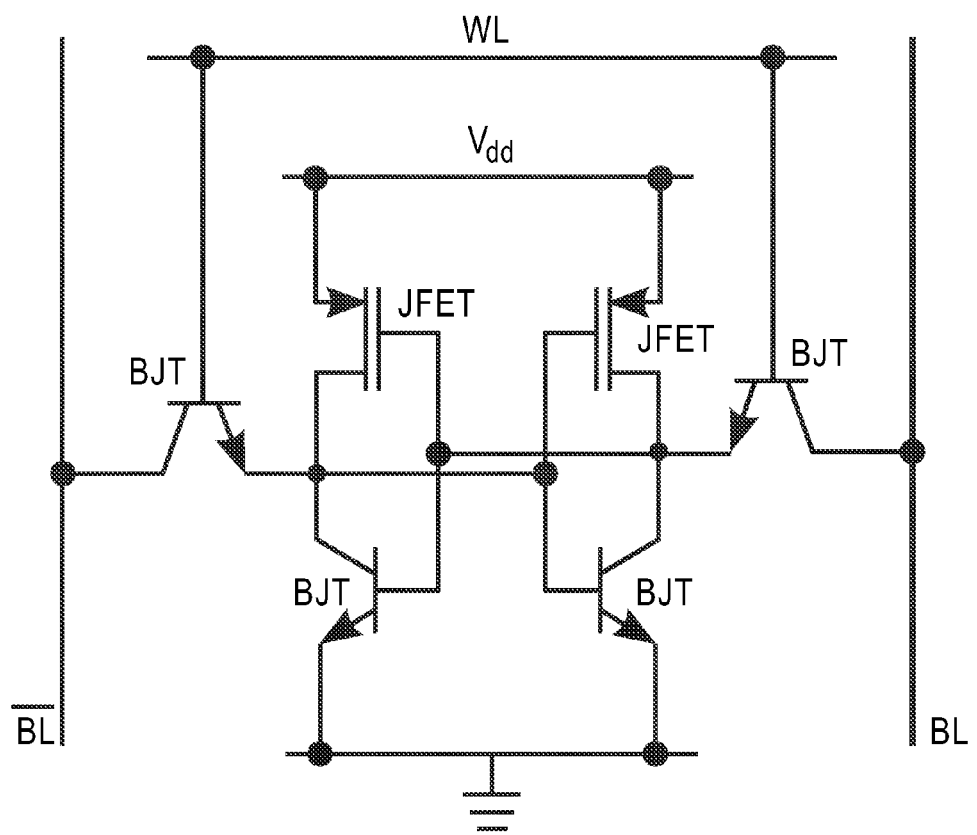
FIG. 31 is a circuit schematic of an exemplary complementary SRAM cell circuit including the semiconductor structure of the present application.

Referring now to FIG. 26, there is illustrated the structure of FIG. 22 after formation of electrode material portions 50 on each crystalline semiconductor portion 18C, 26C in accordance with another embodiment of the present disclosure. As shown, one of the electrode material portions 50A can extend between the different device regions and can be present atop the collector, C, of the HBT and the drain, D, of the JFET. The materials and formation of the electrode material portions 50 in this embodiment of the present application is the same as that previously mentioned above. In this embodiment, each electrode material portion 50 (including 50A) can serve as a first level interconnect metal.

Referring now to FIG. 27, there is illustrated the structure of FIG. 26 after forming an interconnect level 46 containing a metal contact 48. The interconnect level 46 includes a layer of dielectric material 47 which can be selected from the dielectric materials mentioned above for dielectric material 35. The layer of dielectric material 47 can be formed utilizing a deposition process, and then patterned by lithography and etching to include second via openings. The second via openings can extend down to the base, B, and the gate, G. Metal contact 48 can include one of the conductive metals mentioned above for the conductive electrode portions 28, and the second metal contact 48 can be formed utilizing one of the deposition processes mentioned above. The structure shown in FIG. 27 represents an inverter circuit of the present application which is schematically shown in FIGS. 28A-28B of the present application.

Various complementary circuits that can include the semiconductor structure of the present application are now shown by way of example. Other complementary circuits can also be produced utilizing the same basic processing steps mentioned above. In some embodiments of the present application, the complementary circuits can be designed such that one type of transistor (i.e., BJT or JFET) is normally-ON, while the other type of transistor is normally-OFF.

Each complementary circuit of the present application includes a bipolar junction transistor located within a first active region and comprising an emitter of a second conductivity type, a base of a first conductivity type and a collector of the second conductivity type, wherein the base is located between, and laterally spaced apart from, the emitter and the collector, the first active region comprises a first crystalline semiconductor portion of the first conductivity type, and wherein the first conductivity type is opposite from the second conductivity type; and a junction field effect transistor located within a second active region and comprising a drain of the first conductivity type, a gate of the second conductivity type, and a source of the first conductivity type, wherein the gate is located between, and laterally spaced apart from, the drain and the source, the second active region comprises a second crystalline semiconductor portion of the first conductivity type, and wherein there is at least one electrical couple between the bipolar junction transistor and the junction field effect transistor.

In some embodiments and when an inverter circuit if formed, the collector of the bipolar junction transistor is electrically coupled to the drain of the junction field effect transistor and the base of the bipolar junction transistor is electrically coupled to the gate of the junction field effect transistor. In one embodiment where the crystalline semiconductor material 10 is comprised of a p-type semiconductor (See, FIG. 28A), the collector of the bipolar junction transistor is electrically coupled to the drain of the junction field effect transistor, and the base of the bipolar junction transistor is electrically coupled to the gate of the junction field effect transistor. In such an embodiment, the source of the junction field effect transistor is electrically coupled to a voltage source Vdd and the emitter of the bipolar junction transistor is electrically coupled to ground. Note Vdd and ground correspond to the positive and negative terminals of a power supply, respectively. If the ground voltage is defined as the reference voltage (i.e. zero) which is common in the art, then Vdd is a positive voltage. As common in the art, when the crystalline semiconductor material 10 is comprised of a p-type semiconductor, the BJT is typically referred to as an n-p-n BJT and the JFET is typically referred to as a p-JFET. In another embodiment where the crystalline semiconductor material 10 is comprised of an n-type semiconductor, (See, FIG. 28B) the collector of the bipolar junction transistor is electrically coupled to the drain of the junction field effect transistor, the base of the bipolar junction transistor is electrically coupled to the gate of the junction field effect transistor, the source of the junction field effect transistor is electrically coupled to ground and the emitter of the bipolar junction transistor electrically coupled to a voltage source Vdd. As commonly referred to in the art, when the crystalline semiconductor material 10 is comprised of an n-type semiconductor, the BJT is referred to as a p-n-p BJT and the JFET is referred to as an n-JFET.

In some embodiments, and when a pass transistor circuit (see FIG. 29A-29B) is provided, the collector of the bipolar junction transistor is electrically coupled to the drain of the junction field effect transistor and the base of the bipolar junction transistor is electrically coupled to the gate of the junction field effect transistor. Note FIG. 29A illustrates a pass transistor circuit comprised of an n-p-n BJT and a p-JFET implemented on a p-type crystalline semiconductor material 10. A similar pass transistor circuit (see FIG. 29B) comprised of a p-n-p BJT and an n-JFET may be implemented using an n-type crystalline semiconductor material 10.

Referring to FIG. 28A there is shown a circuit schematic of an exemplary complementary inverter circuit including the semiconductor structure of the present application implemented using a p-type semiconductor substrate. Specifically, the inverter circuit shown in FIG. 28A includes the semiconductor structure of the present application. As shown, the gate of the JFET is electrically coupled to the base of the BJT, and both the gate of JFET and the base of the BJT are electrically coupled to input voltage $V_{in}$. As is also shown, the collector of the BJT is electrically coupled to the drain of the JFET, and both the collector or the BJT and the drain of the JFET are electrically coupled output voltage $V_{out}$. As is further shown, the source of the JFET is electrically coupled to supply bias source Vdd, while the emitter of the BJT is electrically coupled to ground, Gnd. The inverter circuit of the present application functions as follows: The input voltage Vin is inverted, i.e., if Vin is low, Vout is high and vice versa. When Vin is high, the BJT is ON and the JFET is OFF, so that Vout is settled to a voltage close to Ggnd, i.e., low. When Vin is low, the BJT is OFF and the JFET is ON, so that Vout is settled to a voltage close to Vdd, i.e., high.

Referring now to FIG. 29A, there is shown a circuit schematic of an exemplary pass transistor circuit including the semiconductor structure of the present application. The swing range of the complementary pass transistor circuit of the present application is improved compared to a single pass transistor. Note D and D_bar are complementary inputs, if D is high, D_bar is low and vice versa. The pass transistor circuit of the present application functions as follows: If a single pass transistor is used, e.g., if only the BJT is used: when D is high, provided that Vin is smaller than D minus the turn-on voltage of the BJT, the BJT is ON and the input voltage Vin is transferred to Vout, i.e., Vout is equal to Vin, minus the voltage drop across the BJT. The voltage drop across the BJT depends on the ON resistance of the BJT and desired to be small so that Vout is as close to Vin as possible. The ON resistance of the BJT however increases as Vin is increased from low to high. Similarly, if only the JFET is used: when D_bar is low, provided that Vin is larger than D_bar minus the threshold voltage of the JFET, the JFET is ON and the input voltage Vin is transferred to Vout, i.e., Vout is equal to Vin, minus the voltage drop across the JFET. The voltage drop across the JFET depends on the ON resistance of the JFET and desired to be small so that Vout is as close to Vin as possible. The ON resistance of the JFET however increases as Vin is decreased from high to low.

However, if a JFET and BJT are used in parallel with D and D_bar control voltages synched to be complementary, the ON resistance of the complementary pass transistor is low for a broader range of Vin (from low to high). This is because the ON resistance of the pass transistor is the parallel combination of the ON resistances of the single pass transistors.

Referring now to FIG. 30, there is illustrated a circuit schematic of an exemplary OLED driver circuit including the semiconductor structure of the present application. In this example, two JFETs are shown and are electrically coupled to a single BJT. As illustrated, the gate of one of JFETs is electrically coupled to the gate of the BJT and the gate of the other JFET is electrically coupled to either the emitter or collector of the BJT. The OLED driver circuit of the present application functions as follows: During the program period, Vselect is high, so the BJT is ON and the program voltage (VDD-VData) is stored across the storage capacitor Cs. Since Vselect is high, the bottom JFET (the one connected to OLED) is OFF to ensure no OLED illumination during the program period, regardless of the value of the voltage across Cs. (Note the voltage across Cs is also the voltage across the Gate-Source of the top JFET and may change during the charge/discharge of Cs).

During the illumination period, Vselect is low, so that the BJT is OFF [and therefore the VData line is disconnected from storage capacitor Cs and can be used to program a neighboring pixel (which now has a high value on its Vselect line) without disturbing this pixel]. Since Vselect is low, the bottom JFET is ON and the OLED illuminates. The OLED brightness depends on the OLED current which in turn depends on the voltage stored across Cs.

In summary, the presence of the BJT and JFET in a complementary configuration (i.e. BJT is ON when JFET is OFF and vice versa) ensures no illumination during the programming of the pixel which eliminates the effect of the transients (during the charging/discharging of Cs) on the pixel brightness. This is particularly important for videos because unlike still images, a different voltage is programmed across Cs every time the pixel is programmed. (The transients during charge/discharge of Cs may produce flicker in the video). Note this exemplary circuit is implemented with a p-type semiconductor substrate. A similar circuit may be implemented with an n-type semiconductor substrate.

Referring now to FIG. 30, there is shown a circuit schematic of an exemplary complementary SRAM cell circuit with the semiconductor structure according to an embodiment of the present application. The illustrated circuit includes a first complementary inverter circuit and a second complementary inverter circuit in a cross-coupled configuration having an output of each inverter feedback as input to the other inverter, wherein both the first complementary and second complementary inverter circuits comprise: a bipolar junction transistor located within a first active region and comprising an emitter of a second conductivity type, a base of a first conductivity type and a collector of the second conductivity type, wherein the base is located between, and laterally spaced apart from, the emitter and the collector, the first active region comprises a first crystalline semiconductor portion of the first conductivity type, and wherein the first conductivity type is opposite from the second conductivity type; and a junction field effect transistor located within a second active region and comprising a drain of the first conductivity type, a gate of the second conductivity type, and a source of the first conductivity type, wherein the gate is located between, and laterally spaced apart from, the drain and the source, the second active region comprises a second crystalline semiconductor portion of the first conductivity type, wherein the collector of the bipolar junction transistor is electrically coupled to the drain of the junction field effect transistor and wherein the base of the bipolar junction transistor is electrically coupled to the gate of the junction field effect transistor, and the source of the junction field effect transistor is electrically coupled to a voltage source Vdd and the emitter of the bipolar junction transistor is electrically coupled to ground. Note this exemplary circuit is implemented with a p-type semiconductor substrate. A similar circuit may be implemented with an n-type semiconductor substrate.

The SRAM cell is comprised of pass transistors (also called access transistors) M5 and M6 which may be either BJT or JFET (BJT in this drawing) and two cross-coupled inverters, the inverter comprised of M1 and M2, and the inverter comprised of M3 and M4. In a conventional SRAM, the inverters are conventional, but in this example they are comprised of a JFET and BJT according to the present application. The operation is the same as that of a conventional SRAM. When the word-line (WL) is asserted (i.e., if WL is high for n-p-n BJT pass transistors as shown in this example or for p-JFET; or if WL is low for p-n-p BJT or for n-JFET pass transistors), the pass transistors are ON, thus allowing the read or write operations by allowing the transfer of the stored values Q and Q_bar to the bit lines BL and BL_bar (read) or the other way (write). Note "bar" denotes complementary values. Since the input of one inverter is connected to the output of the other inverter and vice versa, the input value transferred from the bit lines to the storage nodes is "latched in", i.e., stored while the SRAM is in the idle mode (i.e. when WL is not asserted and therefore the pass transistors are OFF). Note the present disclosure is applicable to other types of SRAM with fewer or larger number of transistors known in the art; by replacing the standard inverters in the SRAM by the inverters disclosed herein. Also note the single pass transistors in SRAM cells may be replaced with complementary pass transistors (which requires the addition of a WL_bar line). This is also applicable to the present disclosure by replacing a conventional complementary pass transistor with a pass transistor according to the principles of the present disclosure.

Note that the process flows within the various embodiments of the present application are non-limiting examples, and may include process steps not shown (for example thermal or chemical treatments) or some process steps may be carried out differently, or in different order. For example, in some embodiments, other processes or device fabrication steps may be performed between forming a first contact region (or a first set of contact regions) and forming a second (or a second set of contact regions) on the same device area, in the vicinity of the same device area, or at other parts of the chip. Also, other process steps typically precede and/or follow the process steps shown in these examples. Also variations to the illustrated process flows (in order, and/or non-critical steps) may be perceived by one skilled in the art. Also, the collector, the emitter, source and base positioning can be switched. Further, and depending on the type of circuit being formed, the metal contacts formed in the various interconnect levels can be switched to provide a desired circuit configuration.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a first active region comprising a first crystalline semiconductor portion of a first conductivity type located on one portion of a surface of an insulator layer, and a second active region comprising a second crystalline semiconductor portion of the first conductivity type located on another portion of the insulator layer, wherein the second active region is laterally spaced apart from the first active region;
a bipolar junction transistor located within the first active region and comprising an emitter of a second conductivity type, a base of the first conductivity type and a collector of the second conductivity type, wherein the base is located between, and laterally spaced apart from, the emitter and the collector; and a junction field effect transistor located within the second active region and comprising a drain of the first conductivity type, a gate of the second conductivity type, and a source of the first conductivity type, wherein the gate is located between, and laterally spaced apart from, the drain and the source, and wherein the first conductivity type is opposite from the second conductivity type.

2. The semiconductor structure of claim 1, wherein said first conductivity type is p-type and the second conductivity type is n-type.

3. The semiconductor structure of claim 1, wherein said first conductivity type is n-type and the second conductivity type is p-type.

4. The semiconductor structure of claim 1, wherein at least one of said bipolar junction transistor and said junction field effect transistor contains at least one heterojunction.

5. The semiconductor structure of claim 1, wherein each of said emitter, said base, said collector, said source, said gate and said drain are comprised of at least one semiconductor material.

6. The semiconductor structure of claim 5, wherein said at least one semiconductor material is crystalline, non-crystalline or a combination of crystalline and non-crystalline.

7. The semiconductor structure of claim 5, wherein each of said emitter, said base, said collector, said source, said gate and said drain comprises a single-crystalline semiconductor material.

8. The semiconductor structure of claim 5, further comprising an electrode material portion located on a topmost semiconductor material of said at least one semiconductor material.

9. The semiconductor structure of claim 5, wherein a single electrode material portion is present on a topmost semiconductor material of said at least one semiconductor material and directly connects said collector to said drain.

10. The semiconductor structure of claim 5, further comprising a sacrificial material portion and a passivation material portion positioned between edge portions of a bottommost semiconductor material of said at least one semiconductor material of said emitter, said base and said collector and said first crystalline semiconductor portion, and between edge portions of a bottommost semiconductor material of said at least one semiconductor material of said drain, said gate and said source and said crystalline semiconductor portion.

* * * * *